(12) United States Patent
Koo et al.

(10) Patent No.: US 9,543,202 B2
(45) Date of Patent: Jan. 10, 2017

(54) METHOD OF FABRICATING SEMICONDUCTOR DEVICE HAVING CONTACT STRUCTURES

(71) Applicant: SAMSUNG ELECTRONICS CO., LTD., Suwon-si, Gyeonggi-do (KR)

(72) Inventors: Jamin Koo, Suwon-si (KR); Youngseok Kim, Seoul (KR); Kongsoo Lee, Hwaseong-si (KR); Goeun Bae, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/060,641

(22) Filed: Mar. 4, 2016

(65) Prior Publication Data
US 2016/0365279 A1 Dec. 15, 2016

(30) Foreign Application Priority Data
Jun. 15, 2015 (KR) .......................... 10-2015-0084279

(51) Int. Cl.
| | |
|---|---|
| *H01L 21/44* | (2006.01) |
| *H01L 21/768* | (2006.01) |
| *H01L 21/285* | (2006.01) |
| *H01L 23/532* | (2006.01) |
| *H01L 21/28* | (2006.01) |

(52) U.S. Cl.
CPC ... *H01L 21/76895* (2013.01); *H01L 21/28518* (2013.01); *H01L 21/76805* (2013.01); *H01L 21/76843* (2013.01); *H01L 21/76864* (2013.01); *H01L 21/28035* (2013.01); *H01L 23/53271* (2013.01)

(58) Field of Classification Search
None
See application file for complete search history.

(56) References Cited

U.S. PATENT DOCUMENTS

| | | | |
|---|---|---|---|
| 7,645,339 B2 | 1/2010 | Singh et al. | |
| 2006/0213547 A1* | 9/2006 | Tanaka | H01L 31/02167 136/244 |
| 2009/0283766 A1* | 11/2009 | Sirkin | H01L 21/02532 257/52 |
| 2010/0237353 A1* | 9/2010 | Chae | H01L 29/41733 257/66 |
| 2012/0178265 A1 | 7/2012 | Miyahara | |

(Continued)

FOREIGN PATENT DOCUMENTS

KR  10-2006-0038589 A  5/2006

OTHER PUBLICATIONS

Sontheimer, et al., "Solution-Processed Crystalline Silicon Thin-Film Solar Cells" Advance Materials Interface, 2014, 1, 1300046.

*Primary Examiner* — Angel Roman
(74) *Attorney, Agent, or Firm* — Lee & Morse, P.C.

(57) ABSTRACT

Provided is a method of fabricating a semiconductor device, the method including forming interconnection structures extending parallel to each other on a substrate; performing a coating process and forming a liquid state silicon source material layer filling an area between the interconnection structures; performing a first annealing process, curing the liquid state silicon source material layer, and forming an amorphous silicon layer; and crystallizing the amorphous silicon layer and forming contact plugs.

20 Claims, 22 Drawing Sheets

(56) References Cited

U.S. PATENT DOCUMENTS

2014/0179092 A1 6/2014 Kim
2014/0370694 A1* 12/2014 Ishihara .............. H01L 27/1292
438/502

* cited by examiner

METHOD OF FABRICATING SEMICONDUCTOR DEVICE HAVING CONTACT STRUCTURES

CROSS-REFERENCE TO RELATED APPLICATION

Korean Patent Application No. 10-2015-0084279, filed on Jun. 15, 2015, in the Korean Intellectual Property Office, and entitled: "Method of Fabricating Semiconductor Device Having Contact Structures," is incorporated by reference herein in its entirety.

BACKGROUND

Embodiments relate to a semiconductor device having a contact structures and a method of fabricating the same.

SUMMARY

Embodiments may be realized by providing a method of fabricating a semiconductor device, the method including forming interconnection structures extending parallel to each other on a substrate; performing a coating process and forming a liquid state silicon source material layer filling an area between the interconnection structures; performing a first annealing process, curing the liquid state silicon source material layer, and forming an amorphous silicon layer; and crystallizing the amorphous silicon layer and forming contact plugs.

The liquid state silicon source material layer may include a silane-based silicon material and a solvent.

The silane-based silicon material may include one or more of cyclopentasilane or neopentasilane.

The solvent may include one or more of toluene, cyclooctane, or ethanol.

The first annealing process may be performed at a temperature of 350° C. or more for 30 to 360 seconds in a nitrogen atmosphere in which oxygen concentration is less than 1 ppm.

The method may further include performing a second annealing process, liquefying the amorphous silicon layer, and curing the liquefied amorphous silicon layer again.

The second annealing process may include a laser annealing process or a plasma annealing process.

The method may further include, after forming the amorphous silicon layer, performing an etch-back process to partially remove the amorphous silicon layer so that upper surfaces of the contact plugs are at lower levels than upper surfaces of the interconnection structures.

The method may further include performing a silicide process and forming silicide patterns on the contact plugs; and forming contact patterns on the silicide patterns.

Forming the contact patterns may include conformally forming a contact barrier layer on upper surfaces of the silicide patterns and sidewalls and upper surfaces of the interconnection structures; forming a contact electrode layer on the contact barrier layer; forming contact pattern isolation trenches partially passed through the contact barrier layer and the contact electrode layer; and filling the contact pattern isolation trenches with a contact pattern isolation insulating material.

The contact pattern isolation insulating material may include silicon nitride.

The coating process may include a spin coating process or slot-die coating process.

Embodiments may be realized by providing a method of fabricating a semiconductor device, the method including forming a device isolation region defining an active region on a substrate; forming gate structures intersecting the active region and extending parallel to each other in a first direction in the substrate; forming interconnection structures extending parallel to each other in a second direction perpendicular to the first direction on a substrate; forming an intermediate interlayer insulating layer filling an area between the interconnection structures that intersect the gate structures and a sacrificial layer filling an area between the interconnection structures that are between the gate structures; removing the sacrificial layer and forming a contact hole exposing end portion of the active region; performing a coating process and forming a liquid state silicon source material layer filling the contact hole; performing a first annealing process, curing the liquid state silicon source material layer, and forming an amorphous silicon layer; and crystallizing the amorphous silicon layer and forming a contact plug.

Forming the intermediate interlayer insulating layer and the sacrificial layer may include forming the sacrificial layer filling all between the interconnection structures; forming a mask pattern exposing the sacrificial layer between the interconnection structures that intersect the gate structures on the interconnection structures and the sacrificial layer; removing the exposed sacrificial layer and forming a hole; and forming the intermediate interlayer insulating layer filling the hole.

The intermediate interlayer insulating layer may include silicon nitride, and the sacrificial layer may include silicon oxide.

Embodiments may be realized by providing a method of fabricating a semiconductor device, the method including forming gate structures extending parallel to each other in a substrate; forming interconnection structures intersecting the gate structures and extending parallel to each other on the substrate, the interconnection structures including first portions that do not intersect the gate structures and second portions that intersect the gate structures; filling an area between the first portions of the interconnection structures with a silicon oxide layer; filling an area between the second portions of the interconnection structures with a silicon nitride layer; removing the silicon oxide layer between the first portions; filling an area between the first portions of the interconnection structures on the substrate by performing a coating process using a liquid state silicon source material layer; converting the liquid state silicon source material layer into an amorphous silicon layer; forming amorphous silicon patterns having upper surfaces at lower levels than upper surfaces of the interconnection structures by partially removing the amorphous silicon layer; and forming polysilicon patterns by crystallizing the amorphous silicon patterns.

The interconnection structures may include interconnection contact patterns, interconnection barrier patterns, interconnection electrode patterns, and interconnection capping patterns stacked sequentially; and upper surfaces of the amorphous silicon patterns may be at higher levels than upper surfaces of the interconnection electrode patterns.

The method may further include, after forming the amorphous silicon patterns, forming holes between the interconnection structures by partially removing the amorphous silicon patterns in a thickness direction.

The method may further include forming spacers on inner sidewalls of the holes.

The spacers may include silicon nitride, and in forming the spacers on inner sidewalls of the holes, the polysilicon patterns may be formed by crystallizing the amorphous silicon patterns, and contact plugs including polysilicon may be formed.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
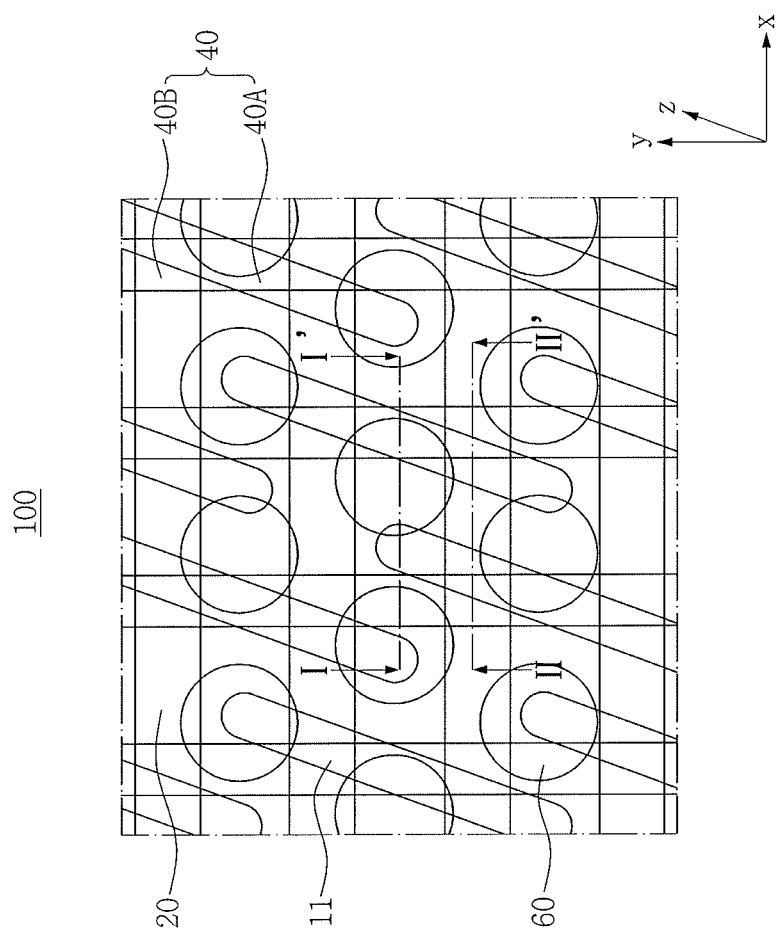
FIG. 1 illustrates a layout of a semiconductor device in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The terminology used herein to describe embodiments is not intended to limit the scope of the inventive concept. The articles "a," "an," and "the" are singular in that they have a single referent; however, the use of the singular form in the present document should not preclude the presence of more than one referent. In other words, elements of the inventive concept referred to in the singular form may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. Therefore, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Like numerals refer to like elements throughout the specification. Accordingly, the same numerals and similar numerals can be described with reference to other drawings, even if not specifically shown in a corresponding drawing. Further, when a numeral is not marked in a drawing, the numeral can be described with reference to other drawings.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure) is illustrated in a cross-sectional view, an electronic device may include a plurality of the device structures (e.g., memory cell structures), as would be illustrated by a plan view of the electronic device. The plurality of device structures may be arranged in an array and/or in a two-dimensional pattern.

FIG. 1 illustrates a layout of a semiconductor device in accordance with an embodiment.

Referring to FIG. 1, a semiconductor device 100 in accordance with an embodiment may include gate structures 20 extending in an X direction, interconnection structures 40 extending in a Y direction perpendicular to the X direction, and active regions 11 in bar shapes extending in a Z direction diagonal to each of the X direction and the Y direction. The interconnection structures 40 may overlap center portions of the active regions 11. The semiconductor devices 100 may include contact structures 60 overlapping both end portions of the active regions 11. The contact structures 60 may include contact plugs 60L on the active regions 11 and contact patterns 60U on the contact plugs 60L.

Figure 2:
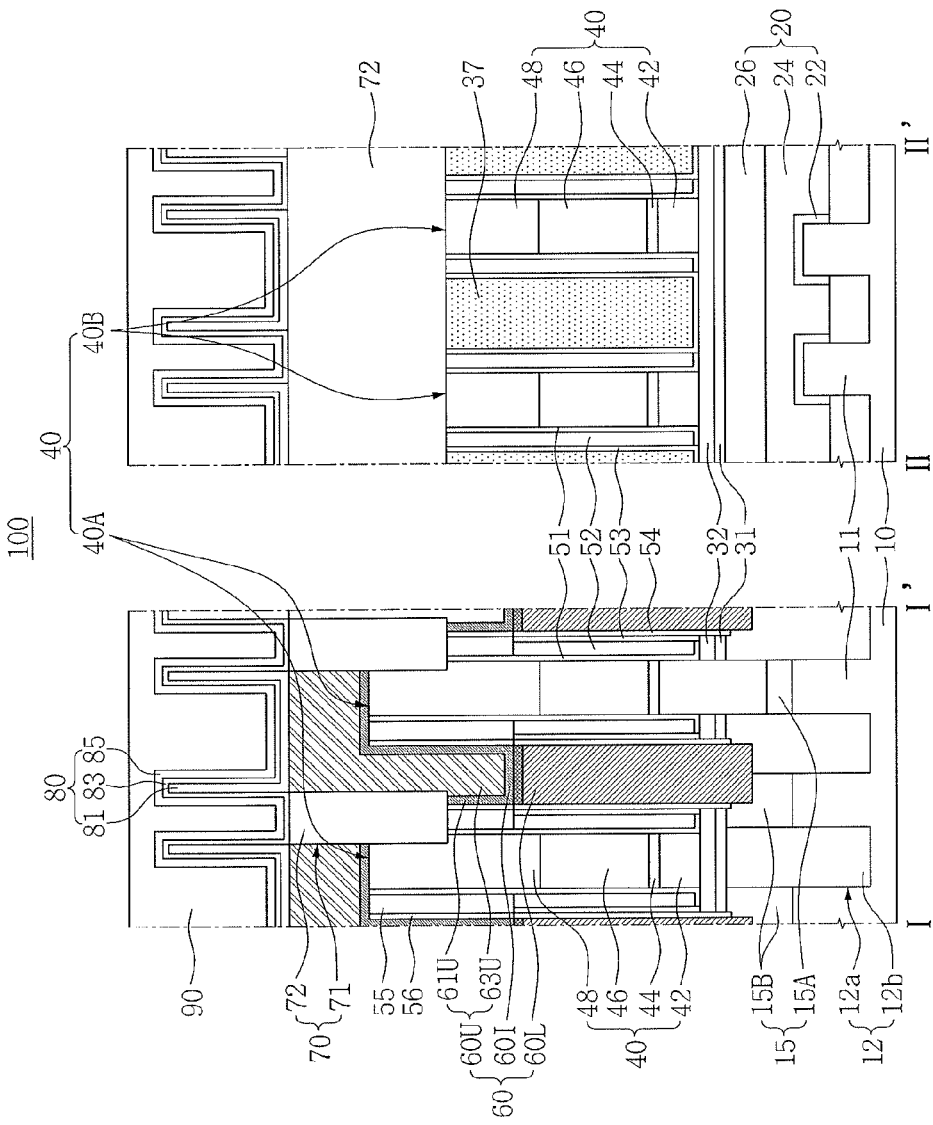
FIG. 2 illustrates longitudinal cross-sectional views taken along lines I-I' and II-II' of FIG. 1 for describing the semiconductor device in accordance with an embodiment.

FIG. 2 illustrates longitudinal cross-sectional views taken along lines I-I' and II-II' of FIG. 1 for describing the semiconductor device 100 in accordance with an embodiment.

Referring to FIGS. 1 and 2, the semiconductor device 100 in accordance with an embodiment may include a device isolation region 12 formed in a substrate 10 and defining active regions 11, source/drain areas 15, gate structures 20, interconnection structures 40, contact structures 60, and capacitor structures 80. The semiconductor device 100 may further include first spacers 51, second spacers 52, third spacers 53, fourth spacers 54, fifth spacers 55, and sixth spacers 56 on sidewalls of the interconnection structures 40. The semiconductor device 100 may further include contact pattern isolation regions 70 which electrically separate the contact structures 60.

The substrate 10 may include a single crystalline semiconductor substrate such as a silicon wafer or a silicon-on-insulator (SOI) wafer.

The device isolation region 12 may include a device isolation trench 12a formed in the substrate 10, and a device isolation insulating material 12b filled in the device isolation trench 12a. The device isolation insulating material 12b may include silicon oxide.

The active regions 11 may include center portions in contact with the interconnection structures 40 and both end portions in contact with the contact structures 60.

The source/drain areas 15 may include first source/drain areas 15A and second source/drain areas 15B. The first source/drain areas 15A may be formed in the center portions of the active regions 11. The second source/drain areas 15B may be formed in the both end portions of the active regions 11. The first source/drain areas 15A may be in contact with the interconnection structures 40. The second source/drain areas 15B may be in contact with the contact structures 60.

The gate structures 20 may include gate insulating patterns 22, gate electrode patterns 24, and gate capping patterns 26. The gate structures 20 may be buried in the substrate 10.

The gate insulating patterns 22 may be conformally formed on upper and side surfaces of the active regions 11. The gate insulating patterns 22 may include silicon oxide, silicon nitride, silicon oxynitride, or a metal oxide. The metal oxide may include one or more of hafnium oxide ($Hf_xO_y$), aluminum oxide ($Al_xO_y$), zirconium oxide ($Zr_xO_y$), lanthanum oxide ($La_xO_y$), or titanium oxide ($Ti_xO_y$).

The gate electrode patterns 24 may be formed to intersect the active regions 11 and to extend onto the device isolation region 12. The gate electrode patterns 24 may include one or more of a metal nitride such as titanium nitride (TiN) or tantalum nitride (TaN), or a metal such as tungsten (W) or copper (Cu). The gate electrode patterns 24 may be word lines of a memory device such as a dynamic random access memory (DRAM) and so on.

The gate capping patterns 26 may be formed on the gate electrode patterns 24. The gate capping patterns 26 may include silicon nitride.

The interconnection structures 40 may include interconnection contact patterns 42, interconnection barrier patterns 44, interconnection electrode patterns 46, and interconnection capping patterns 48.

The interconnection contact patterns 42 may be in contact with the center portions of the active regions 11. For example, the interconnection contact patterns 42 may be in contact with the first source/drain areas 15A. Lower surfaces of the interconnection contact patterns 42 in contact with the first source/drain areas 15A may be located at lower levels than lower surfaces of the interconnection contact patterns 42 in non-contact with the first source/drain areas 15A. The interconnection contact patterns 42 may include polysilicon.

The interconnection barrier patterns 44 may be formed on the interconnection contact patterns 42. The interconnection barrier patterns 44 may include a metal or a metal compound such as titanium (Ti), titanium nitride (TiN), titanium silicide (TiSi), tantalum (Ta), tantalum nitride (TaN), tantalum silicide (TaSi), nickel silicide (NiSi), cobalt silicide (CoSi), tungsten nitride (WN), or tungsten silicide (WSi).

The interconnection electrode patterns 46 may be formed on the interconnection barrier patterns 44. The interconnection electrode patterns 46 may include a metal such as tungsten (W) or copper (Cu).

The interconnection capping patterns 48 may be formed on the interconnection electrode patterns 46. The interconnection capping patterns 48 may include silicon nitride.

For example, the interconnection contact patterns 42 may be bit line contacts of a memory device such as a DRAM and so on. The interconnection barrier patterns 44 and the interconnection electrode patterns 46 may be bit lines of a memory device such as a DRAM and so on.

Sidewalls of the interconnection contact patterns 42, sidewalls of the interconnection barrier patterns 44, sidewalls of the interconnection electrode patterns 46, and sidewalls of the interconnection capping patterns 48 may be vertically aligned.

The interconnection structures 40 may include first portions 40A not vertically overlapping the gate structures 20, and second portions 40B vertically overlapping the gate structures 20. For example, referring to FIG. 1, the first portions 40A of the interconnection structures 40 may be portions not intersecting the gate structures 20, and the second portions 40B of the interconnection structures 40 may be portions intersecting the gate structures 20. Upper surfaces of the first portions 40A of the interconnection structures 40 may be located at higher levels than upper surfaces of the second portions 40B of the interconnection structures 40.

The contact structures 60 may include contact plugs 60L, silicide patterns 60I, and contact patterns 60U. The contact structures 60 may electrically connect the second source/drain areas 15B to the capacitor structure 80.

The contact plugs 60L may be in contact with the second source/drain areas 15B. The contact plugs 60L may include polysilicon. The contact plugs 60L may be located between the first portions 40A of the interconnection structures 40.

The silicide patterns 60I may be formed between the contact plugs 60L and the contact patterns 60U. The silicide patterns 60I may include titanium silicide (TiSi), tungsten silicide (WSi), nickel silicide (NiSi), cobalt silicide (CoSi), or another metal silicide. For example, the silicide patterns 60I may include cobalt silicide (CoSi).

The contact patterns 60U may be formed on the silicide patterns 60I. The contact patterns 60U may include contact barrier patterns 61U and contact electrode patterns 63U.

The contact barrier patterns 61U may be conformally formed on upper surfaces of the silicide patterns 60I, outer side surfaces and upper surfaces of the sixth spacers 56, upper surfaces of the fifth spacers 55, upper surfaces of the first spacers 51, and upper surfaces of the interconnection structures 40. The contact barrier patterns 61U may include one or more of titanium nitride (TiN), tantalum nitride (TaN), or another metal nitride.

The contact electrode patterns 63U may be formed on the contact barrier patterns 61U. The contact electrode patterns 63U may include a metal such as tungsten (W) or copper (Cu). Horizontal widths of upper portions of the contact electrode patterns 63U may be greater than horizontal widths of lower portions of the contact electrode patterns 63U. The lower portions of the contact electrode patterns 63U may be surrounded by the contact barrier patterns 61U.

The capacitor structures 80 may include capacitor lower electrodes 81, a capacitor dielectric layer 83, and a capacitor upper electrode 85.

The capacitor lower electrodes 81 may be electrically connected to the contact structures 60. The capacitor lower electrodes 81 may be in contact with the contact patterns 60U of the contact structures 60. The capacitor lower electrodes 81 may include a conductive material such as doped polysilicon, a metal, or a metal compound.

The capacitor dielectric layer 83 may conformally cover surfaces of the capacitor lower electrodes 81 and surfaces of the contact pattern isolation regions 70. The capacitor dielectric layer 83 may include one or more of a metal oxide, such as hafnium oxide ($Hf_xO_y$), aluminum oxide ($Al_xO_y$), titanium oxide ($Ti_xO_y$), tantalum oxide ($Ta_xO_y$), ruthenium oxide ($Ru_xO_y$), or lanthanum oxide ($La_xO_y$), silicon oxide, or silicon nitride.

The capacitor upper electrode 85 may be conformally formed on the capacitor dielectric layer 83. The capacitor upper electrode 85 may include a metal or a metal compound.

The contact pattern isolation regions 70 may include contact pattern isolation trenches 71 formed in the contact patterns 60U, and contact pattern isolation insulating material 72 filled in the contact pattern isolation trenches 71. The contact pattern isolation trenches 71 may be formed from upper surfaces of the contact electrode patterns 63U toward the substrate 10. The interconnection capping patterns 48 of the interconnection structures 40, the first spacers 51, the fifth spacers 55, and the sixth spacers 56 on the sidewalls of the interconnection capping patterns 48 may be partially recessed by the contact pattern isolation trenches 71. The contact pattern isolation insulating material 72 may include silicon nitride.

The first spacers 51 may be conformally formed on the sidewalls of the interconnection structures 40. The first spacers 51 may include silicon nitride.

The second spacers 52 may be conformally formed on the first spacers 51 on lower sidewalls of the first portions 40A of the interconnection structures 40 and the first spacers 51 on sidewalls of the second portions 40B of the interconnection structures 40. The second spacers 52 may include silicon oxide. Upper surfaces of the second spacers 52 on the sidewalls of the second portions 40B of the interconnection structures 40 may be located at higher levels than upper surfaces of the second spacers 52 on the lower sidewalls of the first portions 40A of the interconnection structures 40.

The third spacers 53 may be conformally formed on the second spacers 52. The third spacers 53 may include silicon nitride. Upper surfaces of the third spacers 53 on the second spacers 52 on the sidewalls of the second portions 40B of the interconnection structures 40 may be located at higher levels than upper surfaces of the third spacers 53 on the second spacers 52 on the lower sidewalls of the first portions 40A of the interconnection structures 40.

The fourth spacers 54 may be formed on sidewalls of the contact plugs 60L. For example, the fourth spacers 54 may be located between the sidewalls of the contact plugs 60L and outer side surfaces of the third spacers 53. The fourth spacers 54 may include silicon nitride. Lower surfaces of the fourth spacers 54 may be located at higher levels than lower surfaces of the contact plugs 60L.

The fifth spacers 55 may be conformally formed on the first spacers 51 on upper sidewalls of the first portions 40A of the interconnection structures 40. The fifth spacers 55 may include silicon nitride.

The sixth spacers 56 may be conformally formed on the fifth spacers 55. The sixth spacers 56 may include silicon nitride.

The semiconductor device 100 may further include an intermediate interlayer insulating layer 37 filling between, e.g., filling an area between, the second portions 40B of the interconnection structures 40. For example, the intermediate interlayer insulating layer 37 may be formed on the third spacers 53 on the sidewalls of the second portions 40B of the interconnection structures 40, and may fill between the second portions 40B of the interconnection structures 40. The intermediate interlayer insulating layer 37 may include silicon nitride. Upper surfaces of the second portions 40B of the interconnection structures 40, upper surfaces of the first, second, and third spaces 51, 52 and 53 on the sidewalls of the second portions 40B of the interconnection structures 40, and a upper surface of the intermediate interlayer insulating layer 37 may be substantially coplanar.

The semiconductor device 100 may further include a first lower interlayer insulating layer 31 on the source/drain areas 15 and the gate structures 20, and a second lower interlayer insulating layer 32 on the first lower interlayer insulating layer 31. The first lower interlayer insulating layer 31 may include silicon oxide. The second lower interlayer insulating layer 32 may include silicon nitride. The first lower interlayer insulating layer 31 and the second lower interlayer insulating layer 32 may be partially passed through by the interconnection structures 40 and the contact structures 60, e.g., the interconnection structures 40 and the contact structures 60 may pass through a portion of the first lower interlayer insulating layer 31 and the second lower interlayer insulating layer 32.

The semiconductor device 100 may further include a capacitor capping insulating layer 90 covering the capacitor structures 80. The capacitor capping insulating layer 90 may include silicon oxide or silicon nitride.

FIGS. 3 to 19 illustrate vertical cross-sectional views taken along lines I-I' and II-II' of FIG. 1 for describing a method of fabricating a semiconductor device in accordance with an embodiment.

Figure 3:
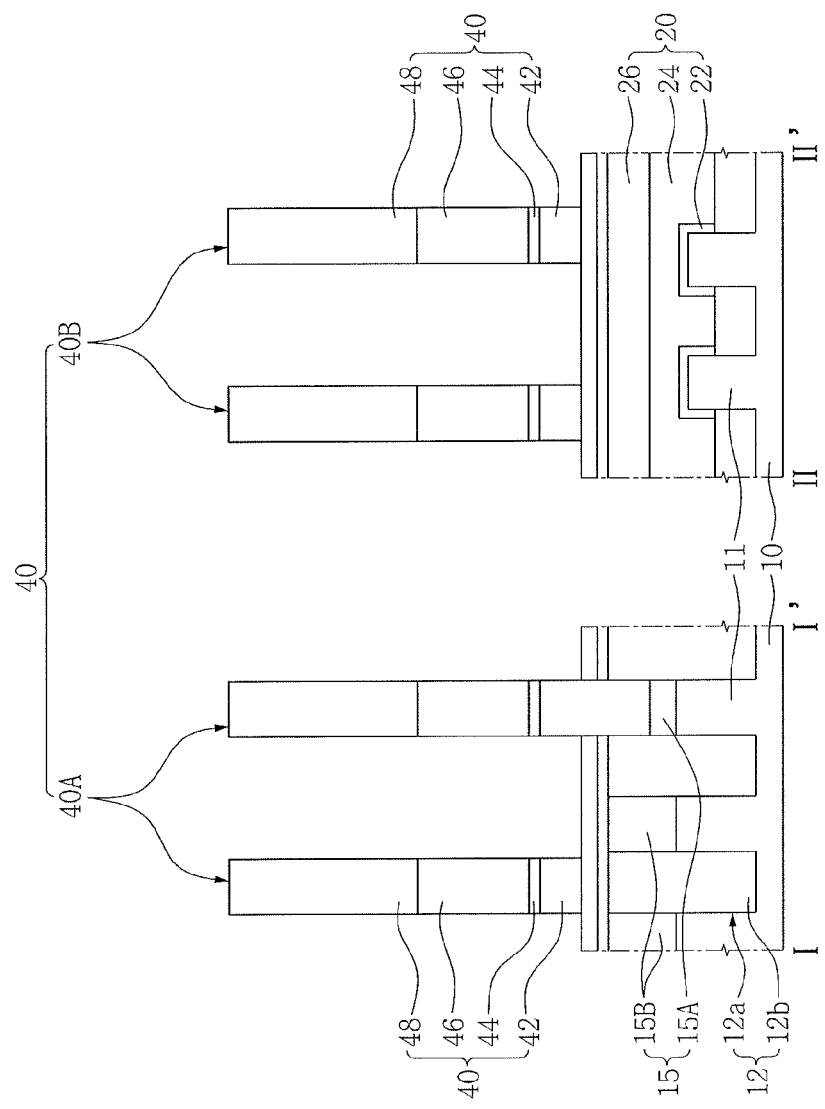
FIGS. 3 to 19 illustrate views of a method of fabricating a semiconductor device according to an embodiment.

Referring to FIG. 3, a method of fabricating a semiconductor device 100 in accordance with an embodiment may include preparing a substrate 10, forming a device isolation region 12 defining active regions 11 in the substrate 10, forming gate structures 20 and source/drain areas 15 in the substrate 10, forming a first lower interlayer insulating layer 31 and a second lower interlayer insulating layer 32 on the substrate 10, and forming interconnection structures 50 on the substrate 10.

The substrate 10 may include a single crystalline semiconductor substrate such as a silicon wafer or SOI wafer.

Forming the device isolation region 12 may include performing a shallow trench isolation (STI) process. The STI process may include forming a device isolation trench 12a in the substrate 10 and filling the device isolation trench 12a with a device isolation insulating material 12b. The device isolation insulating material 12b may include silicon oxide ($SiO_2$).

Forming the gate structures 20 may include forming gate trenches intersecting the active regions 11 and extending onto the device isolation region 12, forming gate insulating patterns 22 on surfaces of the active regions 11 exposed in the gate trenches, forming gate electrode patterns 24 on the gate insulating patterns 22 and the device isolation region 12 exposed in the gate trenches to partially fill the gate trenches, and forming gate capping patterns 26 on the gate electrode patterns 24 to fully fill the gate trenches.

The gate insulating patterns 22 may include silicon oxide, silicon nitride, silicon oxynitride, or a metal oxide. The metal oxide may include one or more of hafnium oxide ($Hf_xO_y$), aluminum oxide ($Al_xO_y$), zirconium oxide ($Zr_xO_y$), lanthanum oxide ($La_xO_y$), or titanium oxide ($Ti_xO_y$). The gate electrode patterns 24 may include one or more of titanium nitride (TiN), tantalum nitride (TaN), tungsten (W), or copper (Cu). The gate capping patterns 26 may include silicon nitride (SiN).

Forming the source/drain areas 15 may include implanting impurity ions in the active regions 11 by an ion implantation process. The source/drain areas 15 may include first source/drain areas 15A and second source/drain areas 15B. For example, the first source/drain areas 15A may be in contact with the interconnection structures 50, and the second source/drain areas 15B may be in contact with contact structures 60 (see FIG. 2) which will be described later. Upper surfaces of the source/drain areas 15 may be located at higher levels than upper surfaces of the gate electrode patterns 24.

The first lower interlayer insulating layer 31 may be entirely formed on the substrate 10 to cover the gate structures 20, the source/drain areas 15, and the device isolation region 12 by performing a deposition process. The first lower interlayer insulating layer 31 may include silicon oxide ($SiO_2$).

The second lower interlayer insulating layer 32 may be entirely formed on the first lower interlayer insulating layer 31. The second lower interlayer insulating layer 32 may include silicon nitride (SiN).

Forming the interconnection structures 40 may include forming recess regions exposing surfaces of the first source/drain areas 15A by partially removing upper portions of the second lower interlayer insulating layer 32, the first lower interlayer insulating layer 31, and the first source/drain areas 15A of the source/drain areas 15 by performing an etching process, forming an interconnection contact layer on the second lower interlayer insulating layer 32 to fill the recess regions by performing a deposition process, forming an interconnection barrier layer on the interconnection contact layer by performing a deposition process, forming an interconnection electrode layer on the interconnection barrier layer by performing a deposition process, forming an interconnection capping layer on the interconnection electrode layer by performing a deposition process, and forming interconnection contact patterns 42, interconnection barrier patterns 44, interconnection electrode patterns 46, and interconnection capping patterns 48 by patterning the interconnection capping layer, the interconnection electrode layer, the interconnection barrier layer, and the interconnection contact layer by performing an etching process.

Portions of the interconnection structures 40 may be in contact with the first source/drain areas 15A, and other portions of the interconnection structures 40 may be in contact with the second lower interlayer insulating layer 32 without contacting with the first source/drain areas 15A. The interconnection may include first portions 40A not vertically overlapping the gate structures 20, and second portions 40B vertically overlapping the gate structures 20. For example, referring to FIG. 1, the first portions 40A of the interconnection structures 40 may be portions not intersecting the gate structures 20, and the second portions 40B of the interconnection structures 40 may be portions intersecting the gate structures 20.

The interconnection contact patterns 42 may include polysilicon. The interconnection barrier patterns 44 may include a metal or a metal compound such as titanium (Ti), titanium nitride (TiN), titanium silicide (TiSi), tantalum (Ta), tantalum nitride (TaN), tantalum silicide (TaSi), nickel silicide (NiSi), cobalt silicide (CoSi), tungsten nitride (WN), or tungsten silicide (WSi). The interconnection electrode patterns 46 may include a metal such as tungsten (W) or copper (Cu). The interconnection capping patterns 48 may include silicon nitride (SiN).

Figure 4:
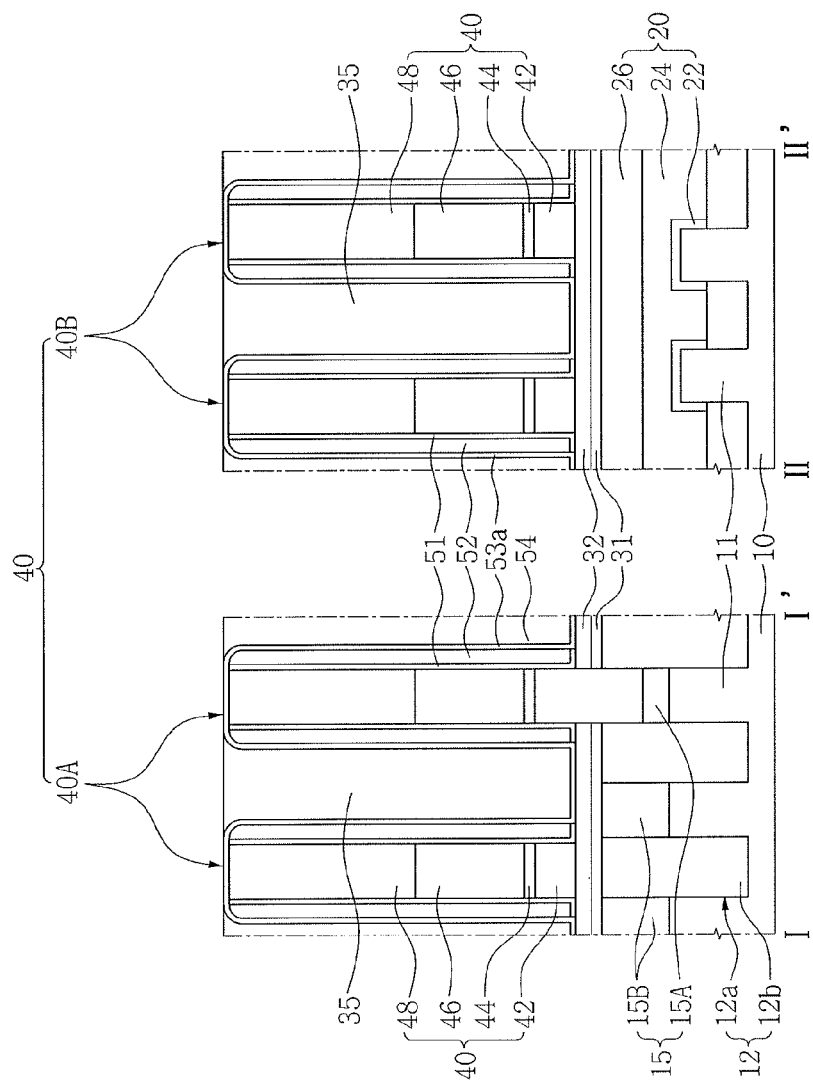

Referring to FIG. 4, the method may include forming first spacers 51 and second spacers 52 on sidewalls of the interconnection structures 40, forming a third spacer material layer 53a covering upper surfaces of the interconnection structures 40, outer side surfaces of the second spacers 52, and a surface of the second lower interlayer insulating layer 32, and forming a sacrificial layer 35 filling between the interconnection structures 40.

Forming the first spacers 51 and the second spacers 52 may include conformally forming a first spacer material layer on upper surfaces and sidewalls of the interconnection structures 40 and the surface of the second lower interlayer insulating layer 32 by performing a deposition process, conformally forming a second spacer material layer on the first spacer material layer, and removing the first spacer material layer and the second spacer material layer that are located on the upper surfaces of the interconnection structures 40 and the surface of the second lower interlayer insulating layer 32 by performing an etching process. The first spacer material layer may include silicon nitride (SiN). The second spacer material layer may include silicon oxide ($SiO_2$).

The third spacer material layer 53a may be conformally formed on the upper surfaces of the interconnection structures 40, the outer side surfaces of the second spacers 52, and the surface of the second lower interlayer insulating layer 32. The third spacer material layer 53a may include silicon nitride (SiN).

Forming the sacrificial layer 35 may include forming a sacrificial insulating layer on the third spacer material layer 53a to fill between the interconnection structures 40 by performing a deposition process, and removing the sacrificial insulating layer on the upper surfaces of the interconnection structures 40 to be exposed the third spacer material layer 53a by performing a planarization process. The sacrificial layer 35 may include silicon oxide ($SiO_2$).

Figure 5:
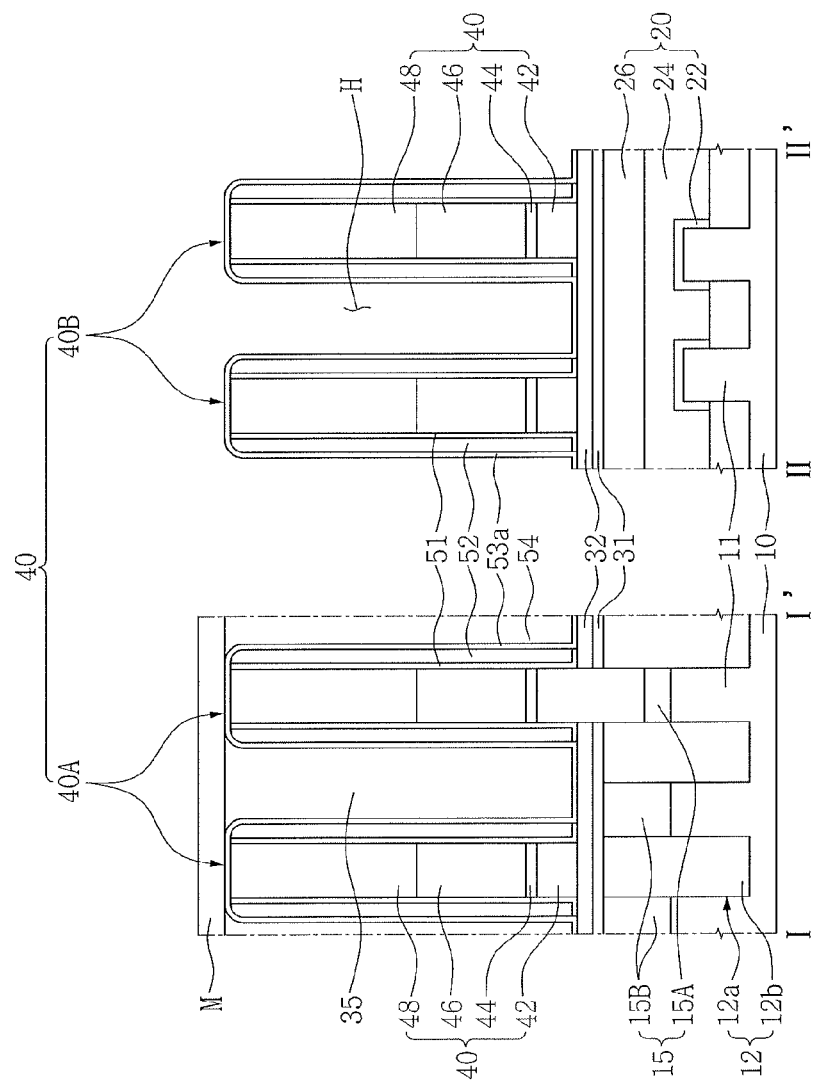

Referring to FIG. 5, the method may include forming holes H between the interconnection structures 40 by patterning the sacrificial layer 35. For example, the holes H may be formed between the second portions 40B of the interconnection structures 40. The patterning of the sacrificial layer 35 may include forming a mask pattern M covering the sacrificial layer 35 between the first portions 40A of the interconnection structures 40 and exposing the sacrificial layer 35 between the second portions 40B of the interconnection structures 40 on the substrate 10 having the sacrificial layer 35, and removing the exposed sacrificial layer 35 by performing an etching process. The mask pattern M may include silicon oxide ($SiO_2$).

Figure 6:
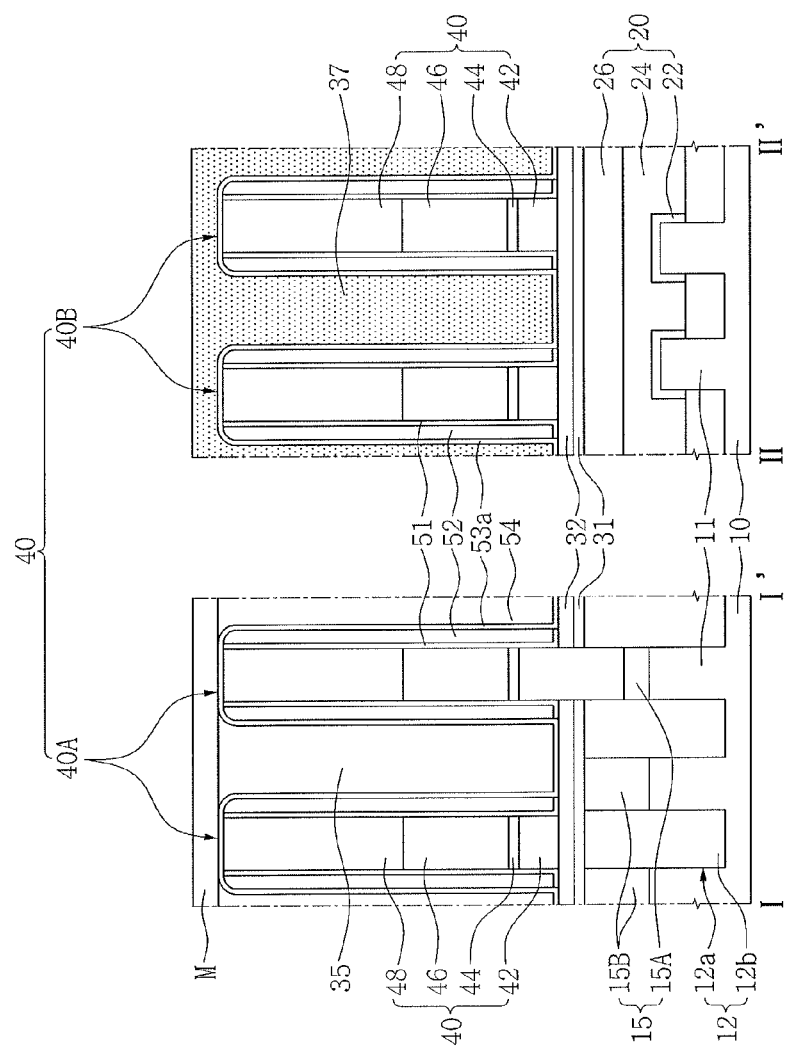

Referring to FIG. 6, the method may include forming an intermediate interlayer insulating layer 37 filling the holes H and covering the interconnection structures 40. For example, the intermediate interlayer insulating layer 37 may be formed to fill between the second portions 40B of the interconnection structures 40, and cover the second portions 40B of the interconnection structures 40. Forming the intermediate interlayer insulating layer 37 may include forming an insulating material layer filling the holes H on the substrate 10 by performing a deposition process, and removing the insulating material layer to be exposed the mask pattern M by performing a planarization process. An upper surface of the intermediate interlayer insulating layer 37 may be substantially coplanar with an upper surface of the mask pattern M in the above process. The upper surface of the intermediate interlayer insulating layer 37 may be located at a higher level than upper surfaces of the second portions 40B of the interconnection structures 40. The intermediate interlayer insulating layer 37 may include silicon nitride.

Figure 7:
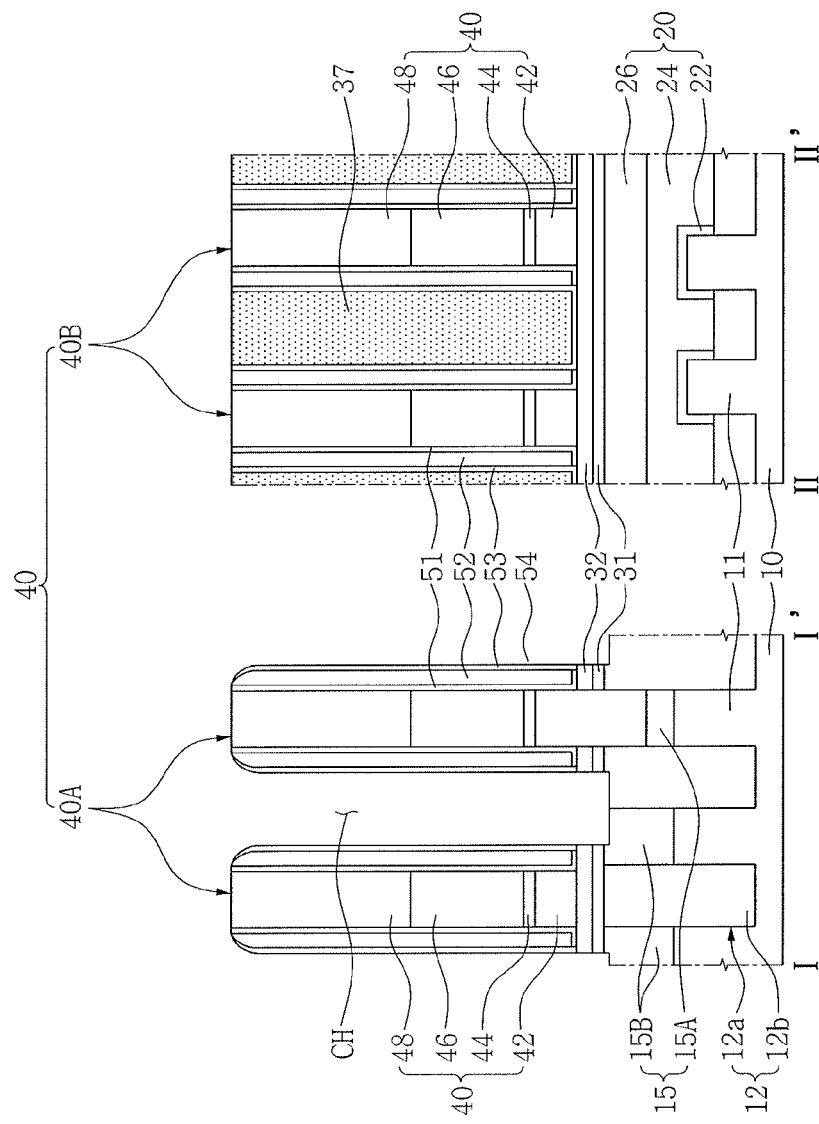

Referring to FIG. 7, the method may include removing the mask pattern M and the sacrificial layer 35 (see FIG. 6) between the first portions 40A of the interconnection structures 40 using the intermediate interlayer insulating layer 37 as an etching mask, and forming contact holes CH by removing the third spacer material layer 53a, the second lower interlayer insulating layer 32, and the first lower interlayer insulating layer 31 under the sacrificial layer 35. Third spacers 53 that are located on the second spacers 52 on the sidewalls of the first portions 40A of the interconnection structures 40 may be formed. Portions of the second source/drain areas 15B and the device isolation region 12 may be exposed by lower surfaces of the contact holes CH, and outer side surfaces of the third spacers 53, side surfaces of the first lower interlayer insulating layer 31, and side surfaces of the second lower interlayer insulating layer 32 may be exposed by inner walls of the contact holes CH. Heights of the intermediate interlayer insulating layer 37, the interconnection structures 40, the first spacers 51, the second spacers 52, and the third spacers 53 may be lowered.

Figure 8:
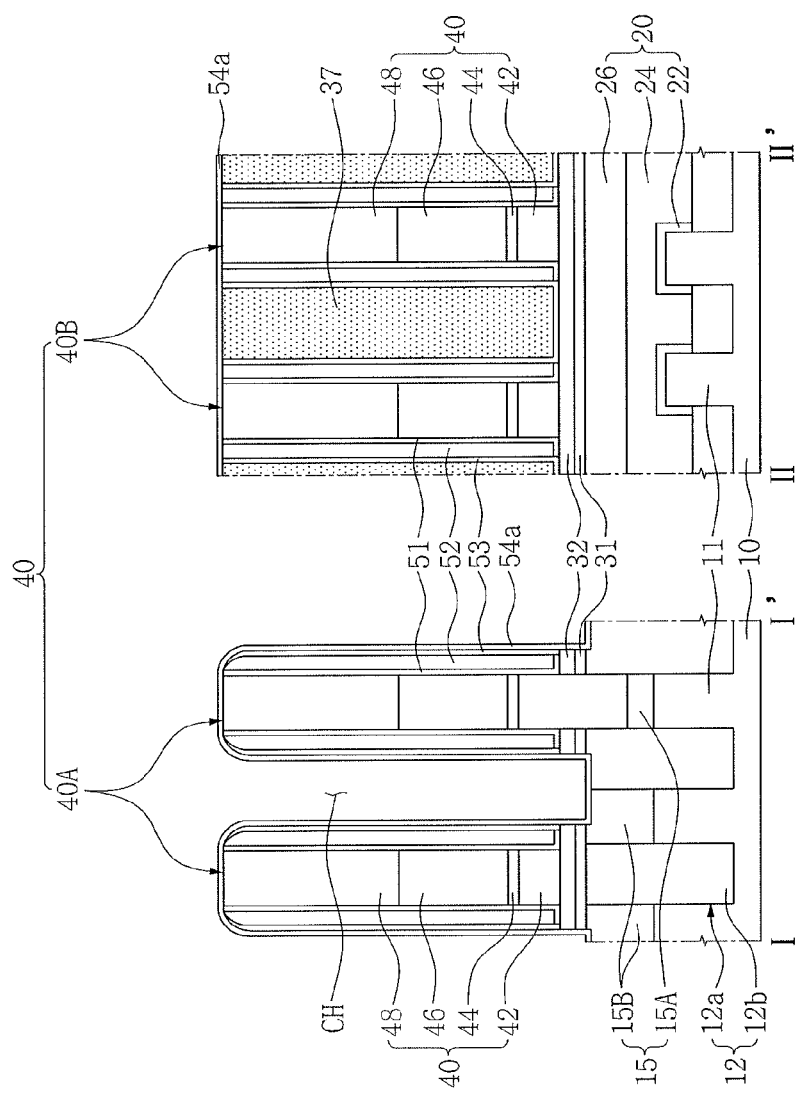

Referring to FIG. 8, the method may include conformally forming a fourth spacer material layer 54a on lower surfaces and inner walls of the contact holes CH, the upper surfaces of the interconnection structures 40, upper surfaces of the first spacers 51, upper surfaces of the second spacers 52, upper surfaces of the third spacers 53, and the intermediate interlayer insulating layer 37 by performing a deposition process. The fourth spacer material layer 54a may include silicon nitride (SiN).

Figure 9:
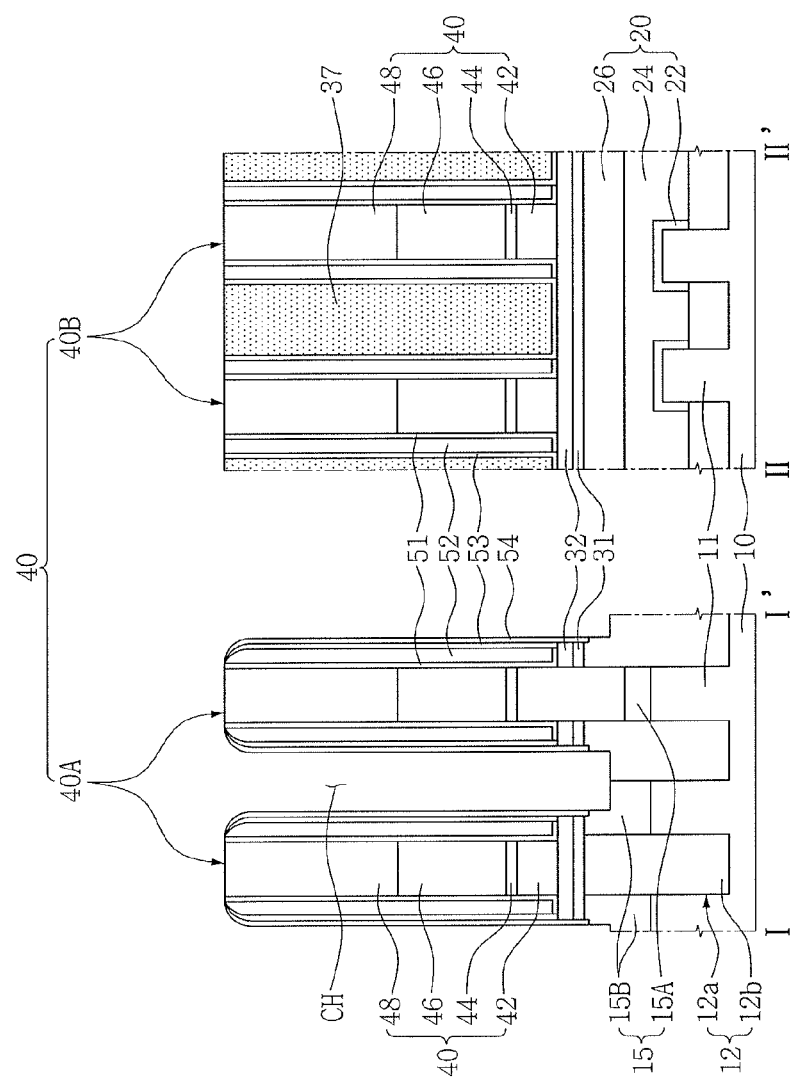

Referring to FIG. 9, the method may include removing the fourth spacer material layer 54a on the lower surfaces of the contact holes CH by performing an etching process, and recessing the lower surfaces of the contact holes CH toward the substrate 10 by removing portions of the second source/drain areas 15B and the device isolation region 12 under the lower surfaces of the contact holes CH. In the above process, the fourth spacer material layer 54a on the upper surfaces of the interconnection structures 40 and the surface of the intermediate interlayer insulating layer 37 may be removed. As a result, fourth spacers 54 located on the third spacers 53 on the sidewalls of the first portions 40A of the interconnection structures 40 may be formed.

Figure 10:
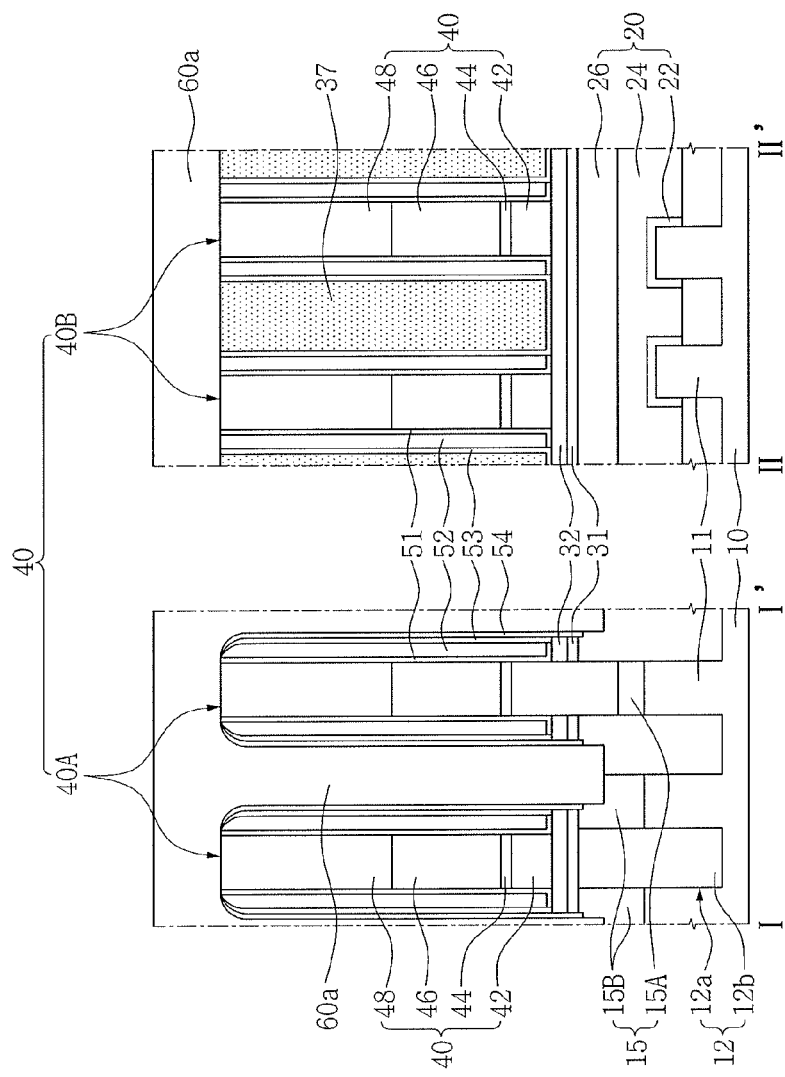

Referring to FIG. 10, the method may include forming a liquid state silicon source material layer 60a filling the contact holes CH and covering the upper surfaces of the interconnection structures 40 and the intermediate interlayer insulating layer 37 on the substrate 10. The liquid state silicon source material layer 60a may include a solvent and a silane-based silicon material. The silane-based silicon material may include one or more of neopentasilane or cyclopentasilane. The solvent may include one or more of toluene, cyclooctane, or ethanol. For example, the liquid state silicon source material may be obtained by oligomerizing the neopentasilane by applying thermal energy or UV light to the neopentasilane, and dissolving the oligomerized neopentasilane in the solvent that has one or more of toluene, cyclooctane, or ethanol.

Figure 20:
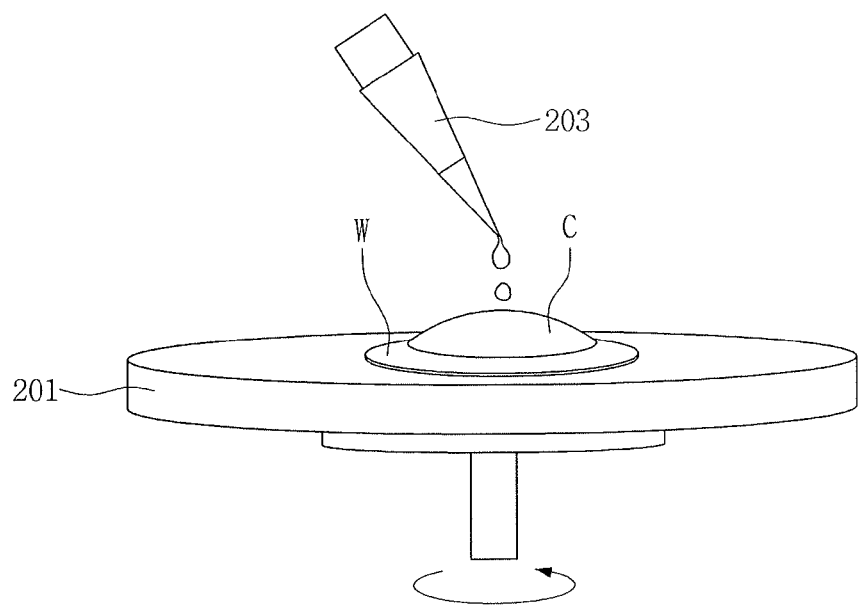
FIGS. 20 and 21 illustrate conceptual diagrams of a spin coating method and a slot die coating method, respectively.
Figure 21:
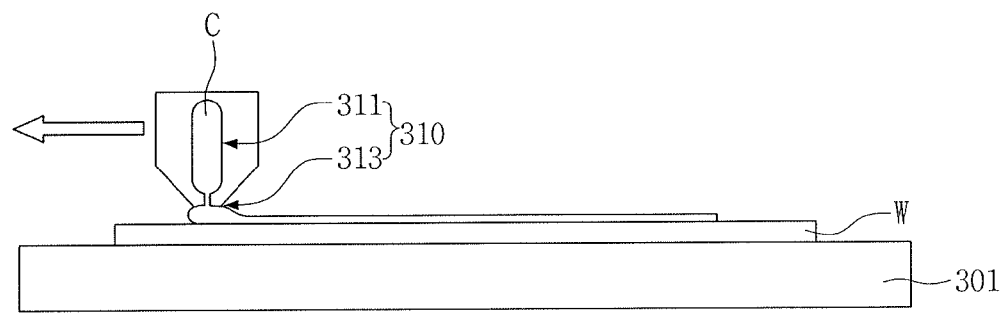

The coating process may include a spin coating process or slot-die coating process. For example, referring to FIG. 20, the spin coating process may be a process that includes disposing a wafer W on a rotatable spin chuck 201, discharging a coating material C onto the wafer W using a nozzle 203, and uniformly coating the wafer W with the coating material C by rotating the spin chuck 201 in an arrow direction. Referring to FIG. 21, the slot-die coating process may be a process that includes disposing a wafer W on a fixed chuck 301, and coating the wafer W with a coating material C by moving a slot-die nozzle 310 in an arrow direction. The slot-die nozzle 310 includes a flow path 311 through which the coating material C is supplied and a nozzle 313 which is connected to the flow path 311 and discharges the coating material C.

Figure 11:
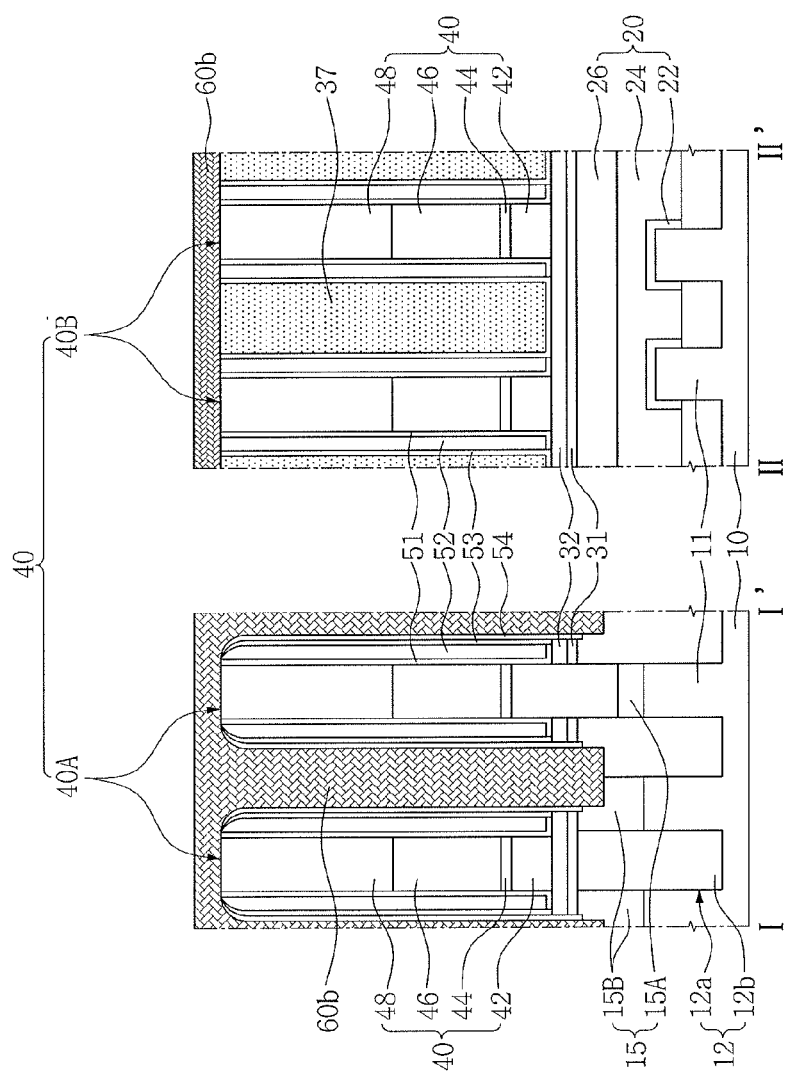

Referring to FIG. 11, the method may include transforming the liquid state silicon source material layer 60a into a hydrogenated amorphous silicon layer 60b by performing a first annealing process. For example, the first annealing process may include a thermal annealing process. The first annealing process may be performed in a nitrogen atmosphere in which oxygen concentration is less than 1 ppm, for example, because the liquid state silicon source material layer 60a may be flammable. The first annealing process may be performed at a temperature of 350° C. or more for 30 to 360 seconds. A height of the amorphous silicon layer 60b may be decreased by evaporating the solvent included in the liquid state silicon source material layer 60a.

Figure 12:
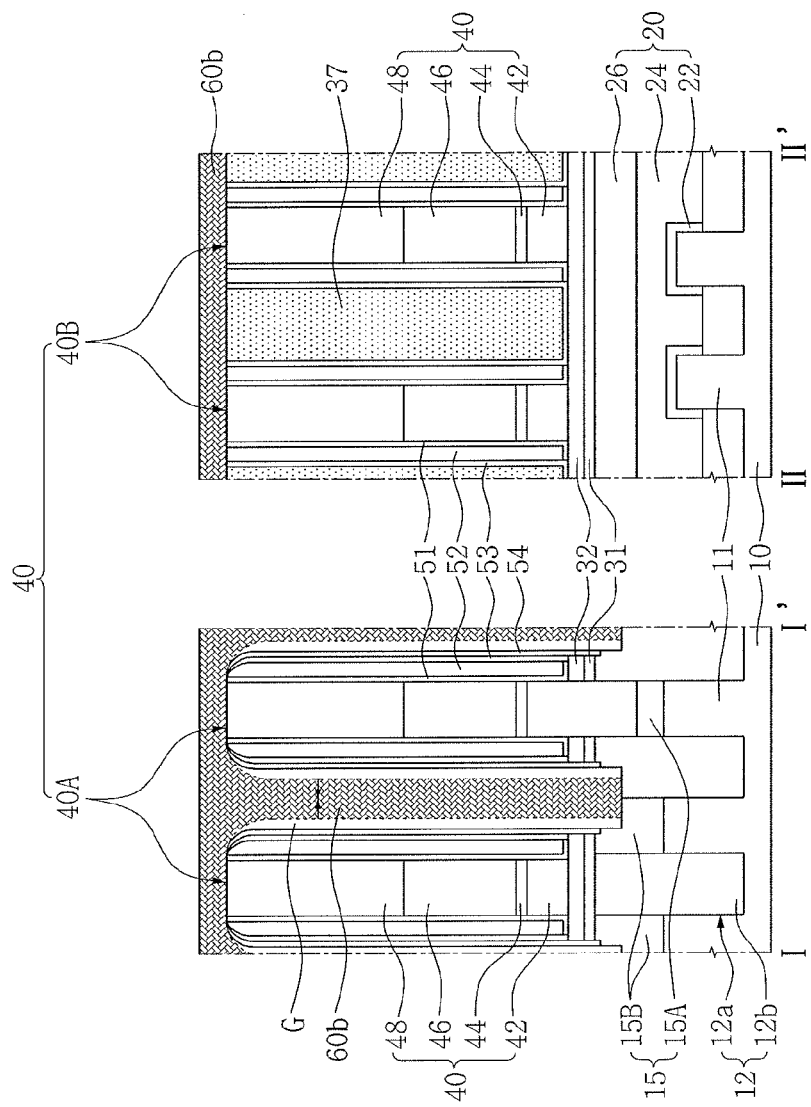

Referring to FIG. 12, gaps G may be formed between the amorphous silicon layer 60b and inner sidewalls of the contact holes CH by shrinking the liquid state silicon source material layer 60a in the contact holes CH in an arrow direction, in the first annealing process.

Figure 13:
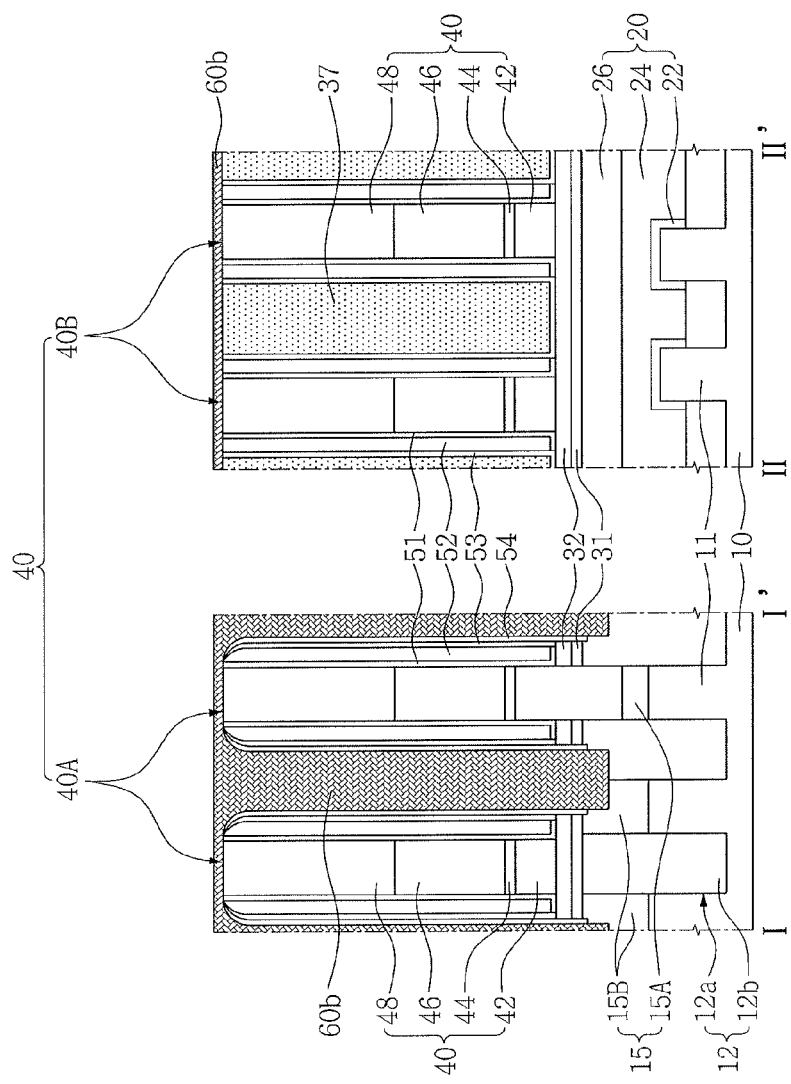

Referring to FIG. 13, in an embodiment, the method may include liquefying the amorphous silicon layer 60b and curing the liquefied amorphous silicon layer 60b again by performing a second annealing process. The second annealing process may include a laser annealing process or a plasma annealing process. At this time, the height of the amorphous silicon layer 60b may be smaller than that of the amorphous silicon layer 60b of FIG. 11.

Figure 14:
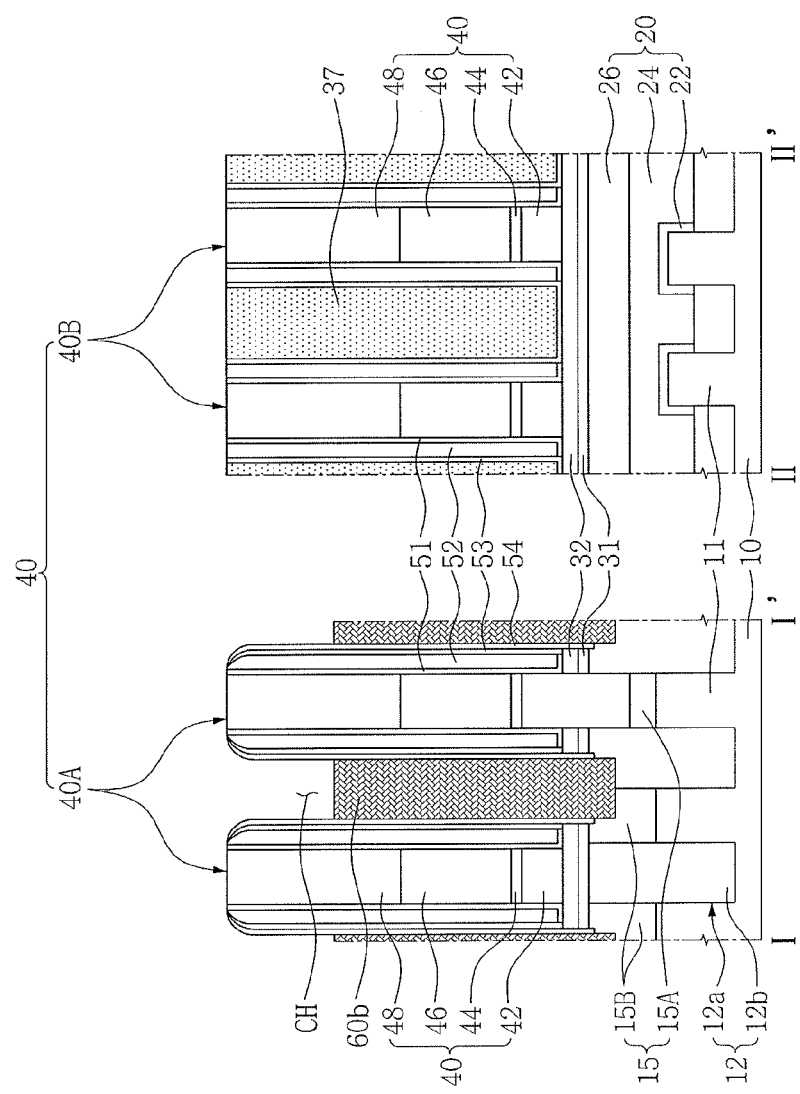

Referring to FIG. 14, the method may include forming amorphous silicon patterns 60b partially filling the contact holes CH by partially removing the amorphous silicon layer 60b by performing an etch-back process. Upper surfaces of the amorphous silicon patterns 60b may be located at higher levels than upper surfaces of the interconnection electrode patterns 46. At this time, heights of the interconnection structures 40, the first spacers 51, the second spacers 52, the third spacers 53, the fourth spacers 54, and the intermediate interlayer insulating layer 37 may be decreased.

Figure 15:
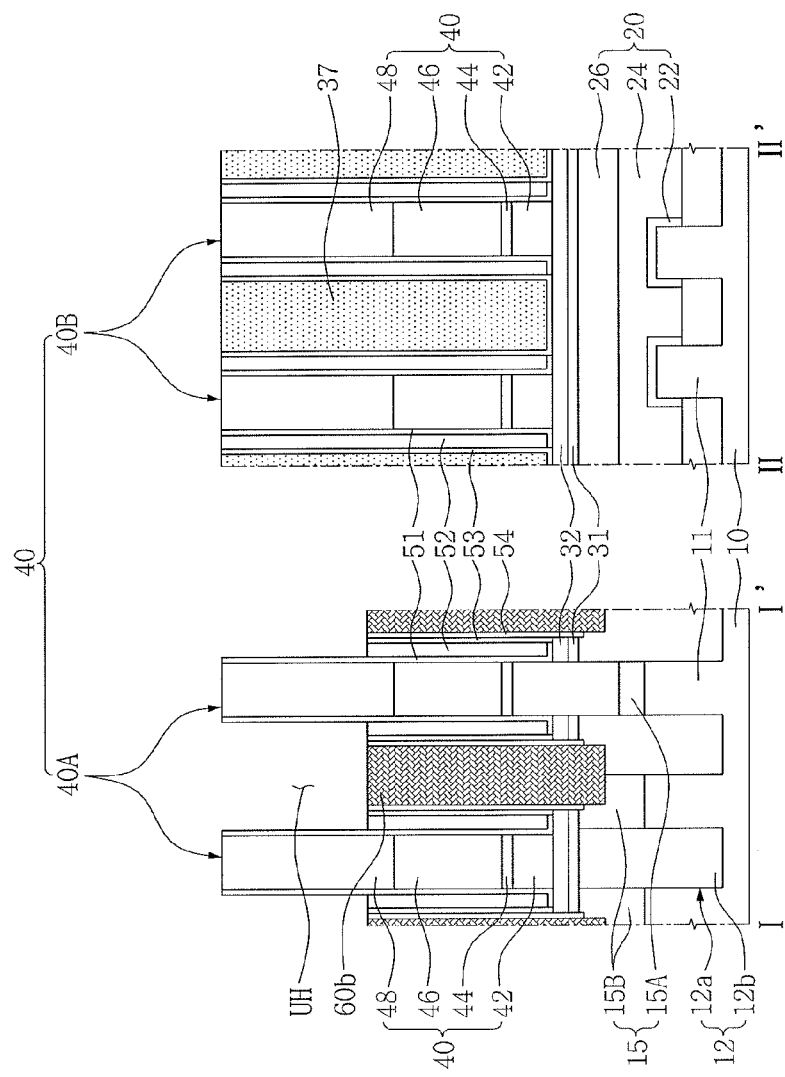

Referring to FIG. 15, the method may include forming upper holes UH by removing the second spacers 52, the third spacers 53, and the fourth spacers 54 on upper sidewalls of the first portions 40A of the interconnection structures 40 by performing an etching process. At this time, the amorphous silicon patterns 60b may be partially removed in a thickness direction. Upper surfaces of the second spacers 52, the third spacers 53, and the fourth spacers 54 may be substantially coplanar with upper surfaces of the amorphous silicon patterns 60b. Upper surfaces of the second spacers 52, the third spacers 53, and the fourth spacers 54 and upper surfaces of the amorphous silicon patterns 60b may be exposed by lower surfaces of the upper holes UH, and outer side surfaces of the first spacers 51 may be exposed by inner walls of the upper holes UH. Horizontal widths of the upper holes UH may be greater than horizontal widths of the amorphous silicon patterns 60b.

Figure 16:
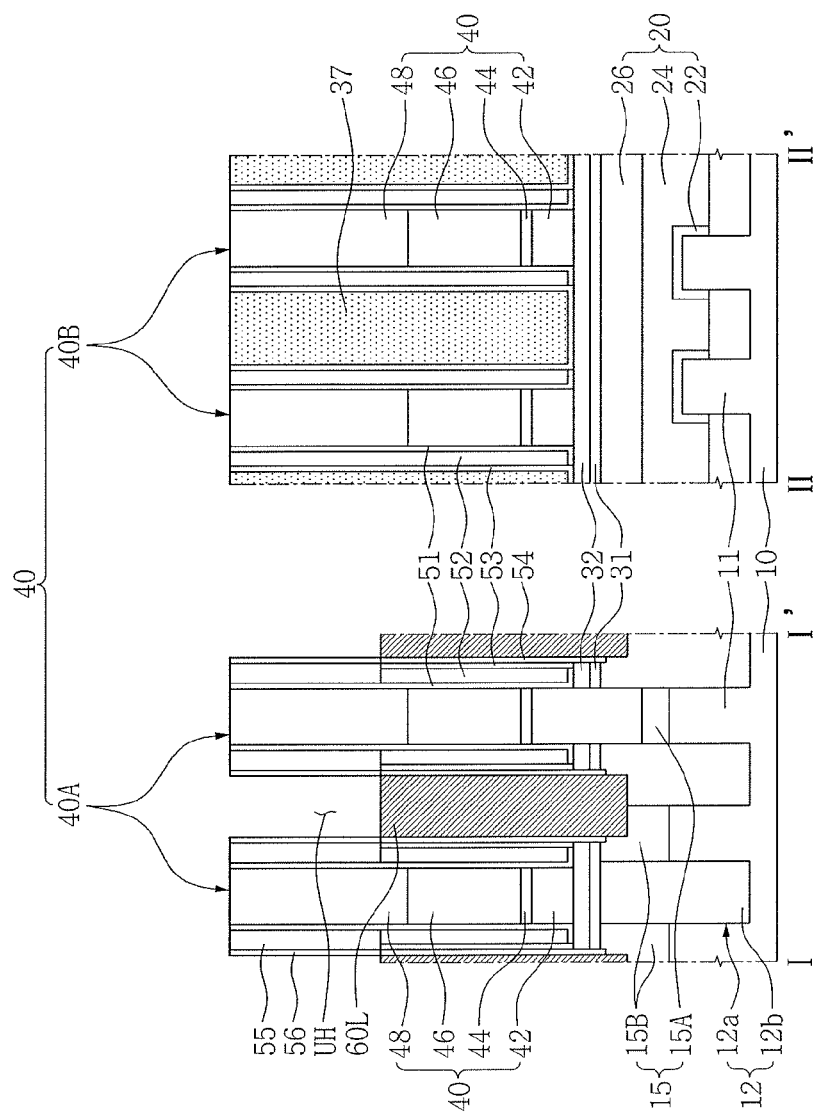

Referring to FIG. 16, the method may include forming fifth spacers 55 and sixth spacers 56 on the inner sidewalls of the upper holes UH.

Forming the fifth spacers 55 may include conformally forming a fifth spacer material layer on the lower surfaces and inner sidewalls of the upper holes UH, the upper surfaces of the interconnection structures 40, the upper surfaces of the first spacers 51, and the upper surface of the intermediate interlayer insulating layer 37, and removing the fifth spacer material layer on the lower surfaces of the upper holes UH by performing an etching process. At this time, the fifth spacer material layer on the upper surfaces of the interconnection structures 40, the upper surfaces of the first spacers 51 and the intermediate interlayer insulating layer 37 may be removed.

Forming the sixth spacers 56 may include conformally forming a sixth spacer material layer on the lower surfaces of the upper holes UH, outer side surfaces of the fifth spacers 55, the upper surfaces of the interconnection structures 40, the upper surfaces of the first spacers 51, and the upper surface of the intermediate interlayer insulating layer 37, and removing the sixth spacer material layer on the lower surfaces of the upper holes UH by performing an etching process. At this time, the sixth spacer material layer on the upper surfaces of the interconnection structures 40, the upper surfaces of the first spacers 51 and the intermediate interlayer insulating layer 37 may be removed.

The fifth spacers 55 and the sixth spacers 56 may include silicon nitride (SiN). In the above process, the amorphous silicon patterns 60b may be crystallized, and contact plugs 60L including polysilicon may be formed.

Figure 17:
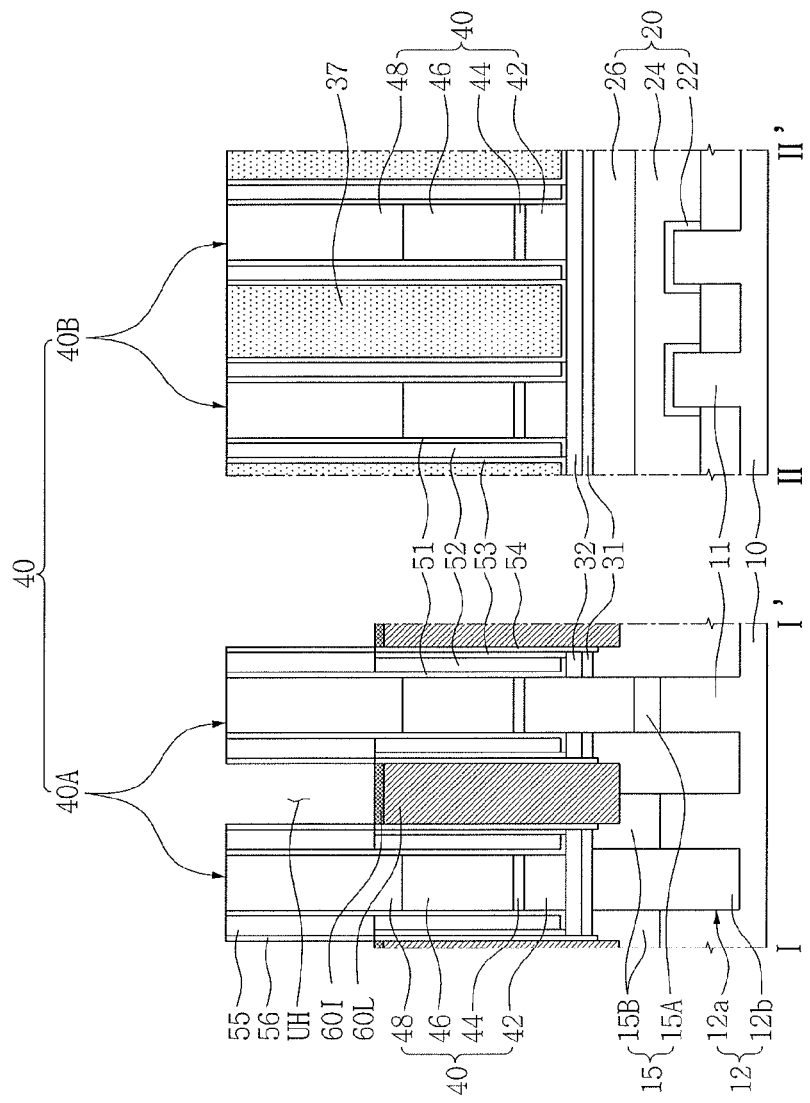

Referring to FIG. 17, the method may include forming silicide patterns 601 on the contact plugs 60L by performing a silicide process. The silicide patterns 601 may include titanium silicide (TiSi), tungsten silicide (WSi), nickel silicide (NiSi), cobalt silicide (CoSi) or another metal silicide. For example, the silicide pattern 601 may include cobalt silicide (CoSi).

Figure 18:
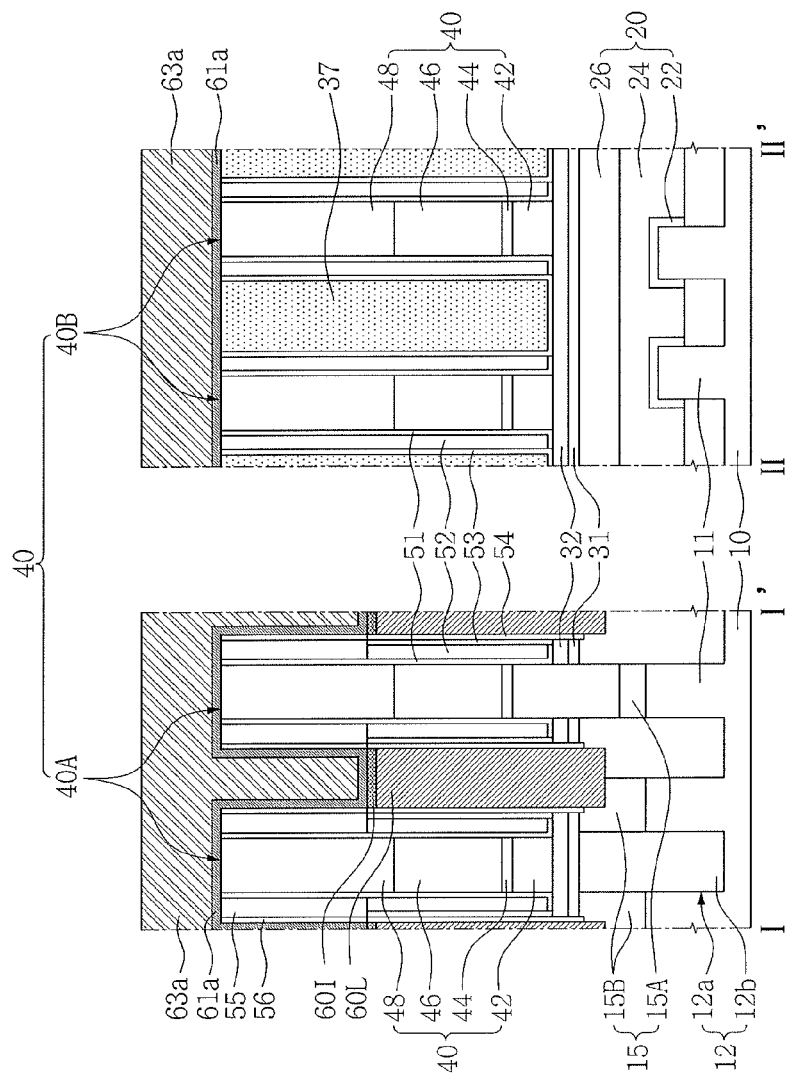

Referring to FIG. 18, the method conformally forming a contact barrier layer 61a on lower surfaces of the upper holes UH (see FIG. 17), the outer side surfaces of the fifth spacers 55, the upper surfaces of the interconnection structures 40, the upper surfaces of the first spacers 51, and the upper surface of the intermediate interlayer insulating layer 37, and forming a contact electrode layer 63a on the contact barrier layer 61a to fill the upper holes UH. The contact barrier layer 61a may include one or more of titanium nitride (TiN), tantalum nitride (TaN), or another metal nitride. The contact electrode layer 63a may include a metal material such as tungsten (W) or copper (Cu).

Figure 19:
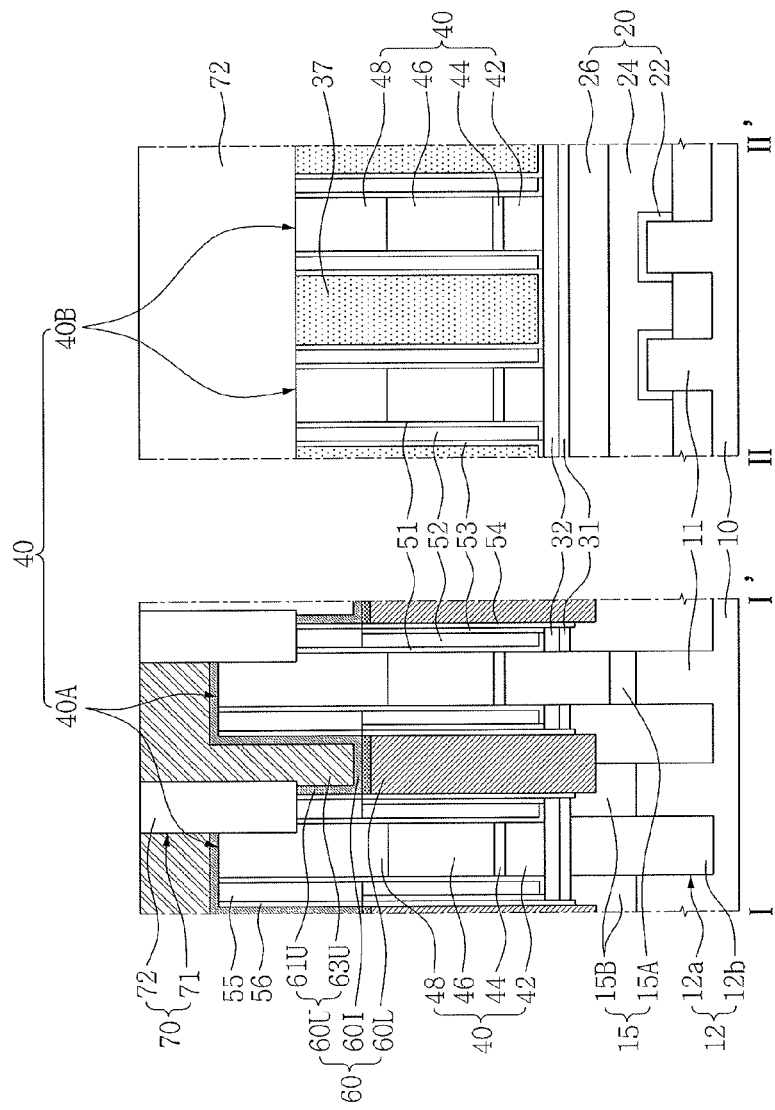

Referring to FIG. 19, the method may include forming contact pattern isolation trenches 71 by partially removing the contact electrode layer 63a and the contact barrier layer 61a by performing an etching process, and forming contact pattern isolation regions 70 by filling the contact pattern isolation trenches 71 with contact pattern isolation material 73, e.g., the contact pattern isolation trenches 71 may be formed partially passed through the contact barrier layer 61a and the contact electrode layer 63a.

Contact patterns 60U including contact barrier pattern 61U and contact electrode patterns 63U may be formed by patterning the contact barrier layer 61a and the contact electrode layer 63a by the contact pattern isolation trenches 71. The interconnection capping patterns 48 of the interconnection structures 40, the first spacers 51, the second spacers 52, the third spacers 53, the fifth spacers 55, the sixth spacers 56, and the intermediate interlayer insulating layer 37 may be partially removed by the contact pattern isolation trenches 71.

Referring again to FIG. 2, the method may include forming capacitor structures 80 on the contact patterns 60U, and forming a capacitor capping insulating layer 90 covering the capacitor structures 80.

A method of fabricating the semiconductor device 100 according to an embodiment has been described above. In the method of fabricating the semiconductor device 100 in accordance with an embodiment, contact holes CH may fill with a liquid state silicon source material by performing a coating process such as a spin coating or slot-die coating, and the contact holes CH may be filled without gaps even when a horizontal width of the contact holes may be reduced and an inner wall shape of the contact holes may not be uniform. Contact patterns that may not have physical defects such as seams or voids may be formed, and electrical characteristics of the semiconductor device may be improved.

Figure 22:
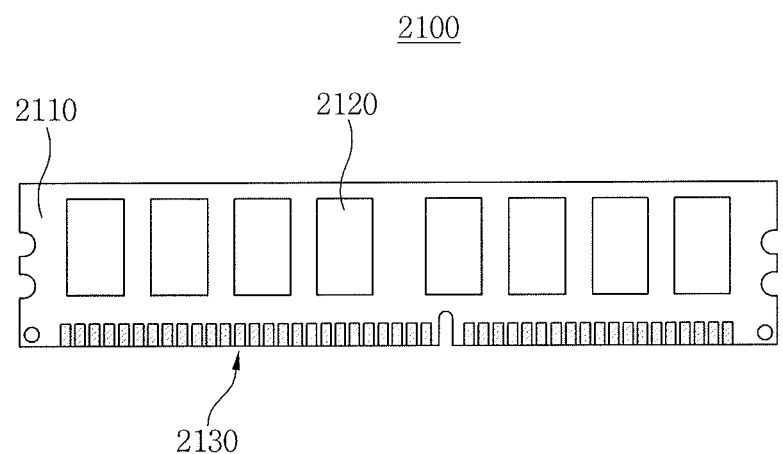
FIG. 22 illustrates a conceptual diagram of a memory module in accordance with an embodiment.

FIG. 22 illustrates a conceptual diagram of a memory module 2100 in accordance with an embodiment. Referring to FIG. 22, the memory module 2100 in accordance with an embodiment may include a module substrate 2110, a plurality of memory devices 2120 disposed on the module substrate 2110, and a plurality of terminals 2130 arranged on a side of the module substrate 2110. The module substrate 2110 may include a printed circuit board (PCB). The memory devices 2120 may include the semiconductor device 100 in accordance with an embodiment. The plurality of terminals 2130 may include a metal such as copper. Each of the terminals 2130 may be electrically connected to each of the memory devices 2120. The memory module 2100 may include memory devices 2120 having a low leakage current and superior carrier mobility, and device performance may be improved.

Figure 23:
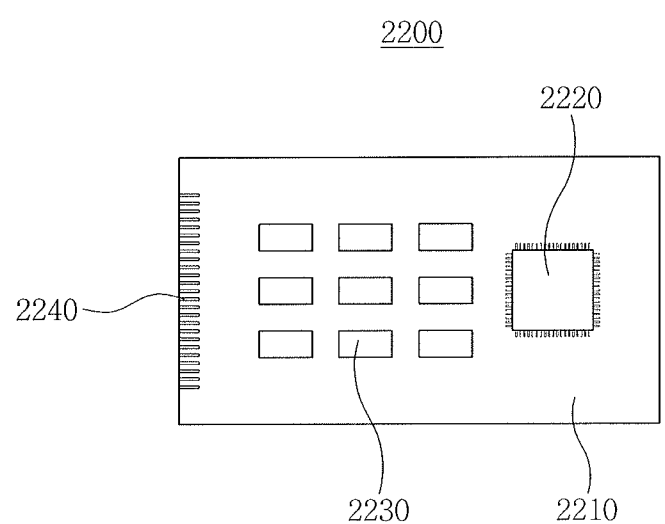
FIG. 23 illustrates a conceptual diagram of a semiconductor module in accordance with an embodiment.

FIG. 23 illustrates a conceptual diagram of in accordance with an embodiment. Referring to FIG. 23, the semiconductor module 2200 in accordance with an embodiment may include a processor 2220 mounted on a module substrate 2210, and semiconductor devices 2230. The processor 2220 or the semiconductor devices 2230 may include the semiconductor device 100 in accordance with an embodiment. Conductive input/output terminals 2240 may be disposed on at least one side of the module substrate 2210.

Figure 24:
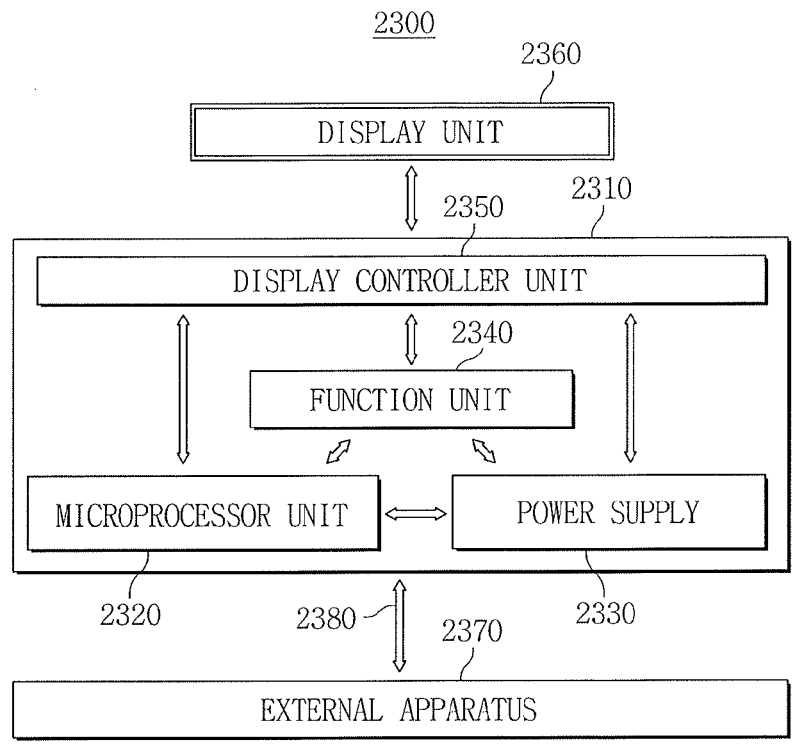
FIGS. 24 and 25 illustrate conceptual block diagrams of electronic systems according to embodiments.

FIG. 24 illustrates a conceptual block diagram of an electronic system in accordance with an embodiment. Referring to FIG. 24, the electronic system 2300 in accordance with an embodiment may include a body 2310, a display unit 2360, and an external apparatus 2370. The body 2310 may include a microprocessor unit 2320, a power supply 2330, a function unit 2340, and/or a display controller unit 2350. The body 2310 may be a system board or motherboard including a PCB and/or a case. The microprocessor unit 2320, the power supply 2330, the function unit 2340, and the display controller unit 2350 may be mounted or arranged on an upper surface or an inside of the body 2310. The display unit 2360 may be disposed on the upper surface of the body 2310 or an inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen, and the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for a dry cell, or a voltage/current converter. The microprocessor unit 2320 may receive a voltage from the power supply 2330 to control the function unit 2340 and the display unit 2360. For example, the microprocessor unit 2320 may include a central processing unit (CPU) or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a Universal Serial Bus (USB) port, and other units having various functions. The microprocessor unit 2320 or the function unit 2340 may include the semiconductor device 100 in accordance with an embodiment.

Figure 25:
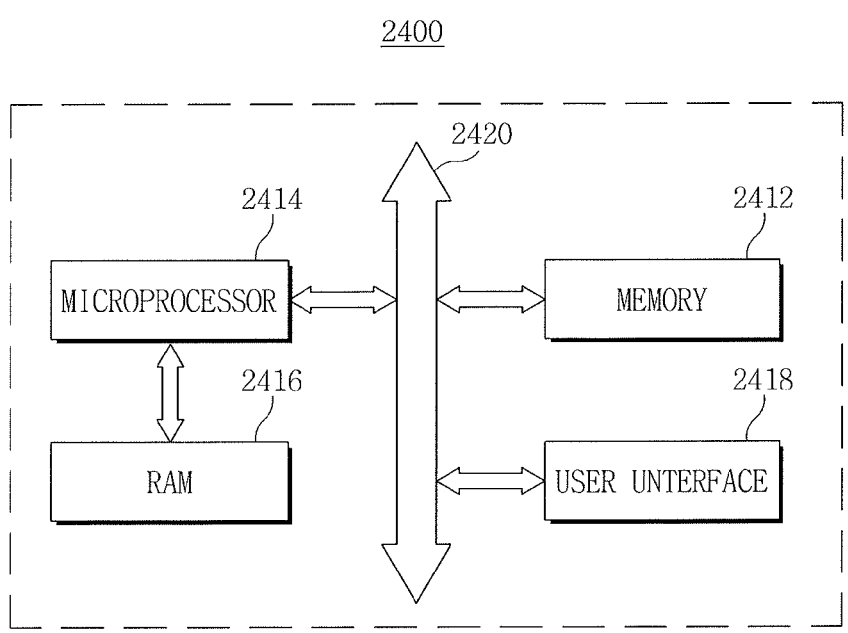

Referring to FIG. 25, an electronic system 2400 in accordance with an embodiment may include a microprocessor 2414, a memory 2412, and a user interface 2418 which may perform data communication through a bus 2420. The microprocessor 2414 may include a CPU or an AP. The electronic system 2400 may further include a random access memory (RAM) 2416 in direct communication with the microprocessor 2414. The microprocessor 2414 and/or the RAM 2416 may be assembled in a single package. The user interface 2418 may be used to input or output data to or from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, lighting, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include the semiconductor device 100 in accordance with an embodiment.

By way of summation and review, semiconductor devices may be used in the electronics industry, for example, because of a small size, multifunctionality, and/or a low manufacturing cost. Semiconductor devices may become highly integrated along with the development of the electronics industry, and as a size of a contact hole may become smaller due to, for example, the high integration of semiconductor devices, a process of enlarging the contact hole may be performed in order to increase an area in contact with an active region, for example. Physical defects such as voids may occur in a contact plug formed in the contact hole, for example, because an inner shape of the contact hole may not be uniform. As a thickness of a polysilicon layer to be deposited becomes small by decreasing a size of a contact hole, seams may occur in the contact plug by degrading a morphology of a polysilicon layer. Due to, for example, physical defects such as the voids and seams, resistive failures of the semiconductor devices may occur.

Embodiments may provide a semiconductor device having contact structures that may not have physical defects. Embodiments may provide a method of fabricating the semiconductor device. Embodiments may provide electronic devices including the semiconductor devices.

In the method of fabricating the semiconductor device in accordance with an embodiment, contact holes may be filled with a liquid state silicon source material using a coating process, the contact holes may be filled without gaps even when a horizontal width of the contact holes may be reduced and an inner wall shape of the contact holes may not be uniform. Contact patterns that may not have physical defects such as seams or voids may be formed, and electrical characteristics of the semiconductor device may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   forming interconnection structures extending parallel to each other on a substrate;
   performing a coating process and forming a liquid state silicon source material layer filling an area between the interconnection structures;
   performing a first annealing process, curing the liquid state silicon source material layer, and forming an amorphous silicon layer; and
   crystallizing the amorphous silicon layer and forming contact plugs.

2. The method as claimed in claim 1, wherein the liquid state silicon source material layer includes a silane-based silicon material and a solvent.

3. The method as claimed in claim 2, wherein the silane-based silicon material includes one or more of cyclopentasilane or neopentasilane.

4. The method as claimed in claim 2, wherein the solvent includes one or more of toluene, cyclooctane, or ethanol.

5. The method as claimed in claim 1, wherein the first annealing process is performed at a temperature of 350° C. or more for 30 to 360 seconds in a nitrogen atmosphere in which oxygen concentration is less than 1 ppm.

6. The method as claimed in claim 1, further comprising performing a second annealing process, liquefying the amorphous silicon layer, and curing the liquefied amorphous silicon layer again.

7. The method as claimed in claim 6, wherein the second annealing process includes a laser annealing process or a plasma annealing process.

8. The method as claimed in claim 1, further comprising, after forming the amorphous silicon layer, performing an etch-back process to partially remove the amorphous silicon layer so that upper surfaces of the contact plugs are at lower levels than upper surfaces of the interconnection structures.

9. The method as claimed in claim 8, further comprising:
   performing a silicide process and forming silicide patterns on the contact plugs; and
   forming contact patterns on the silicide patterns.

10. The method as claimed in claim 9, wherein forming the contact patterns includes:

conformally forming a contact barrier layer on upper surfaces of the silicide patterns and sidewalls and upper surfaces of the interconnection structures;
forming a contact electrode layer on the contact barrier layer;
forming contact pattern isolation trenches partially passed through the contact barrier layer and the contact electrode layer; and
filling the contact pattern isolation trenches with a contact pattern isolation insulating material.

11. The method as claimed in claim 10, wherein the contact pattern isolation insulating material includes silicon nitride.

12. The method as claimed in claim 1, wherein the coating process includes a spin coating process or slot-die coating process.

13. A method of fabricating a semiconductor device, the method comprising:
forming a device isolation region defining an active region on a substrate;
forming gate structures intersecting the active region and extending parallel to each other in a first direction in the substrate;
forming interconnection structures extending parallel to each other in a second direction perpendicular to the first direction on a substrate;
forming an intermediate interlayer insulating layer filling an area between the interconnection structures that intersect the gate structures and a sacrificial layer filling an area between the interconnection structures that are between the gate structures;
removing the sacrificial layer and forming a contact hole exposing end portion of the active region;
performing a coating process and forming a liquid state silicon source material layer filling the contact hole;
performing a first annealing process, curing the liquid state silicon source material layer, and forming an amorphous silicon layer; and
crystallizing the amorphous silicon layer and forming a contact plug.

14. The method as claimed in claim 13, wherein forming the intermediate interlayer insulating layer and the sacrificial layer includes:
forming the sacrificial layer filling all between the interconnection structures;
forming a mask pattern exposing the sacrificial layer between the interconnection structures that intersect the gate structures on the interconnection structures and the sacrificial layer;
removing the exposed sacrificial layer and forming a hole; and
forming the intermediate interlayer insulating layer filling the hole.

15. The method as claimed in claim 14, wherein the intermediate interlayer insulating layer includes silicon nitride, and the sacrificial layer includes silicon oxide.

16. A method of fabricating a semiconductor device, the method comprising:
forming gate structures extending parallel to each other in a substrate;
forming interconnection structures intersecting the gate structures and extending parallel to each other on the substrate, the interconnection structures including first portions that do not intersect the gate structures and second portions that intersect the gate structures;
filling an area between the first portions of the interconnection structures with a silicon oxide layer;
filling an area between the second portions of the interconnection structures with a silicon nitride layer;
removing the silicon oxide layer between the first portions;
filling an area between the first portions of the interconnection structures on the substrate by performing a coating process using a liquid state silicon source material layer;
converting the liquid state silicon source material layer into an amorphous silicon layer;
forming amorphous silicon patterns having upper surfaces at lower levels than upper surfaces of the interconnection structures by partially removing the amorphous silicon layer; and
forming polysilicon patterns by crystallizing the amorphous silicon patterns.

17. The method as claimed in claim 16, wherein:
the interconnection structures include interconnection contact patterns, interconnection barrier patterns, interconnection electrode patterns, and interconnection capping patterns stacked sequentially; and
upper surfaces of the amorphous silicon patterns are at higher levels than upper surfaces of the interconnection electrode patterns.

18. The method as claimed in claim 17, further comprising, after forming the amorphous silicon patterns, forming holes between the interconnection structures by partially removing the amorphous silicon patterns in a thickness direction.

19. The method as claimed in claim 18, further comprising forming spacers on inner sidewalls of the holes.

20. The method as claimed in claim 19, wherein the spacers include silicon nitride, and in forming the spacers on inner sidewalls of the holes, the polysilicon patterns are formed by crystallizing the amorphous silicon patterns, and contact plugs including polysilicon are formed.

\* \* \* \* \*